US 8,552,516 B2

(12) United States Patent
Murakoshi et al.

(10) Patent No.: US 8,552,516 B2
(45) Date of Patent: Oct. 8, 2013

(54) SOLID STATE IMAGE CAPTURE DEVICE AND METHOD FOR MANUFACTURING SAME

(75) Inventors: Atsushi Murakoshi, Oita-ken (JP); Tsubasa Harada, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 12/829,678

(22) Filed: Jul. 2, 2010

(65) Prior Publication Data

US 2011/0084350 A1    Apr. 14, 2011

(30) Foreign Application Priority Data

Oct. 14, 2009 (JP) ................. 2009-237189

(51) Int. Cl.
*H01L 31/0232* (2006.01)

(52) U.S. Cl.
USPC ............ 257/432; 257/E31.097; 257/E21.127

(58) Field of Classification Search
USPC .......................... 257/432, E31.097, E21.127
See application file for complete search history.

(56) References Cited

U.S. PATENT DOCUMENTS

| | | | |
|---|---|---|---|
| 6,809,008 B1* | 10/2004 | Holm et al. | 438/455 |
| 2005/0104148 A1* | 5/2005 | Yamamoto et al. | 257/432 |
| 2007/0012970 A1* | 1/2007 | Mouli | 257/292 |
| 2008/0128848 A1 | 6/2008 | Suzuki et al. | |
| 2009/0146148 A1 | 6/2009 | Pyo | |
| 2009/0159943 A1 | 6/2009 | Jun | |
| 2010/0006908 A1* | 1/2010 | Brady | 257/291 |
| 2010/0225774 A1* | 9/2010 | Enomoto et al. | 348/222.1 |
| 2010/0237452 A1* | 9/2010 | Hagiwara et al. | 257/432 |

FOREIGN PATENT DOCUMENTS

| | | |
|---|---|---|
| JP | 2003-31785 | 1/2003 |
| JP | 2005-150463 | 6/2005 |
| JP | 2005-191492 | 7/2005 |
| JP | 2005-268738 | 9/2005 |
| TW | 200507289 A | 2/2005 |
| TW | 200939465 A | 9/2009 |

OTHER PUBLICATIONS

U.S. Appl. No. 12/883,483, filed Sep. 16, 2010, Murakoshi.
Chinese Office Action issued Aug. 31, 2012, in China Patent Application No. 201010271652.0 (with English translation).
Combined Chinese Office Action and Search Report Issued Apr. 19, 2013 in Patent Application No. 201010271652.0 (with English translation).
Office Action (with English translation) issued on May 24, 2013, in counterpart Taiwanese Appln No. 099127585 (9 pages).

* cited by examiner

*Primary Examiner* — David Vu
*Assistant Examiner* — Brandon Fox
(74) *Attorney, Agent, or Firm* — Oblon, Spivak, McClelland, Maier & Neustadt, L.L.P.

(57) ABSTRACT

According to one embodiment, a solid state image capture device includes a multilayered interconnect layer, a semiconductor substrate, a pillar diffusion layer and an insulating member. The multilayered interconnect layer includes an interconnect. The semiconductor substrate is provided on the multilayered interconnect layer and the semiconductor substrate has a through-trench. The pillar diffusion layer is formed in the semiconductor substrate around the through-trench. In addition, an insulating member is filled into the through-trench.

7 Claims, 25 Drawing Sheets

LIGHT PROPAGATION DIRECTION

LIGHT PROPAGATION DIRECTION

LIGHT PROPAGATION DIRECTION

LIGHT PROPAGATION DIRECTION

LIGHT PROPAGATION DIRECTION

LIGHT PROPAGATION DIRECTION

LIGHT PROPAGATION DIRECTION

SOLID STATE IMAGE CAPTURE DEVICE AND METHOD FOR MANUFACTURING SAME

CROSS-REFERENCE TO RELATED APPLICATIONS

This application is based upon and claims the benefit of priority from the prior Japanese Patent Application No. 2009-237189, filed on Oct. 14, 2009; the entire contents of which are incorporated herein by reference.

FIELD

Embodiments described herein relate generally to a solid state image capture device and a method for manufacturing the same.

BACKGROUND

Conventionally, front-side illuminated solid state image capture devices have been developed in which a multilayered interconnect layer is provided on the top face of a semiconductor substrate; and color filters and microlenses are provided on the multilayered interconnect layer. In the front-side illuminated solid state image capture device, photodiodes are formed in the surface layer portion of the semiconductor substrate; and transfer gates are formed in the multilayered interconnect layer. The photodiodes are formed of, for example, an n-type diffusion region partitioned into each of the pixels by a p-type barrier layer. Light incident on the semiconductor substrate from above via the microlens, the color filter, and the multilayered interconnect layer undergoes photoelectric conversion by the photodiode; and the electrons produced are read via the transfer gate.

The utilization efficiency of light for such a front-side illuminated solid state image capture device is low because the light entering from the outside is incident on the semiconductor substrate after passing through the multilayered interconnect layer. Therefore, the amount of light incident on the photodiode of each of the pixels decreases as the pixel size is reduced; and the sensitivity undesirably decreases. Also, the distance between the pixels decreases as the pixel size is reduced. Therefore, problems such as color mixing also may occur when light incident on one pixel undergoes diffused reflection by the metal interconnects in the multilayered interconnect layer and enters another pixel. Color mixing causes the resolution of color to decrease; and subtle color differences cannot be discriminated.

To solve such problems, back-side illuminated solid state image capture devices have been proposed in which light is incident on the bottom face side of the semiconductor substrate, i.e., the side where the multilayered interconnect layer is not provided (for instance, refer to JP-A 2003-31785 (Kokai)). The light utilization efficiency is high and the sensitivity is high for back-side illuminated solid state image capture devices because light entering from the outside is incident on the semiconductor substrate without passing through the multilayered interconnect layer.

Drawing out the interconnects from the multilayered interconnect layer is problematic for back-side illuminated solid state image capture devices. Considering the mounted configuration of solid state image capture devices, it is favorable to draw out the interconnects upward, i.e., to the side where light enters. Therefore, it is conceivable to make a large hole in the semiconductor substrate, expose the interconnect of the multilayered interconnect layer at the bottom of the hole, and perform wire bonding directly to the exposed interconnect via the hole.

However, in such a case, the wire bonding portion cannot be utilized as a marker for the positional alignment when forming the color filters on the semiconductor substrate. Therefore, when forming the color filters, an infrared ray is irradiated from the support substrate side; and the shadow of the uppermost interconnect layer due to the infrared ray passing through the support substrate, the multilayered interconnect layer, and the semiconductor substrate is identified and utilized as a marker.

However, in such a solid state image capture device, the positional alignment of the uppermost interconnect layer of the multilayered interconnect layer is performed using the interconnect layer therebelow as the reference; the positional alignment of the lowermost interconnect layer of the multilayered interconnect layer is performed using the contact as the reference; the positional alignment of the contact is performed using the gate electrode as the reference; and the positional alignment of the gate electrode is performed using an STI (shallow trench isolation) formed on the lower face of the semiconductor substrate as the reference. Accordingly, the positional alignment of the color filter is performed indirectly from the first reference of the STI via the gate electrode, the contact, the lowermost interconnect layer, one or more intermediate interconnect layers, and the uppermost interconnect layer to the color filter in this order. On the other hand, the positional alignment of the barrier layer partitioning the pixels also is performed using the STI as the reference.

Thus, the fluctuation is undesirably large because the relative positional relationship between the color filter and the barrier layer is determined indirectly by numerous components interposed therebetween. As a result, high integration of the pixels is difficult as the pixels are downscaled because it is difficult to position the boundary between the color filters in the region directly above the barrier layer. Although it is conceivable to independently form an alignment mark dedicated to the positional alignment of the semiconductor substrate, the number of processes would undesirably increase and the process costs of the solid state image capture device would undesirably increase greatly.

DETAILED DESCRIPTION

Figure 1:
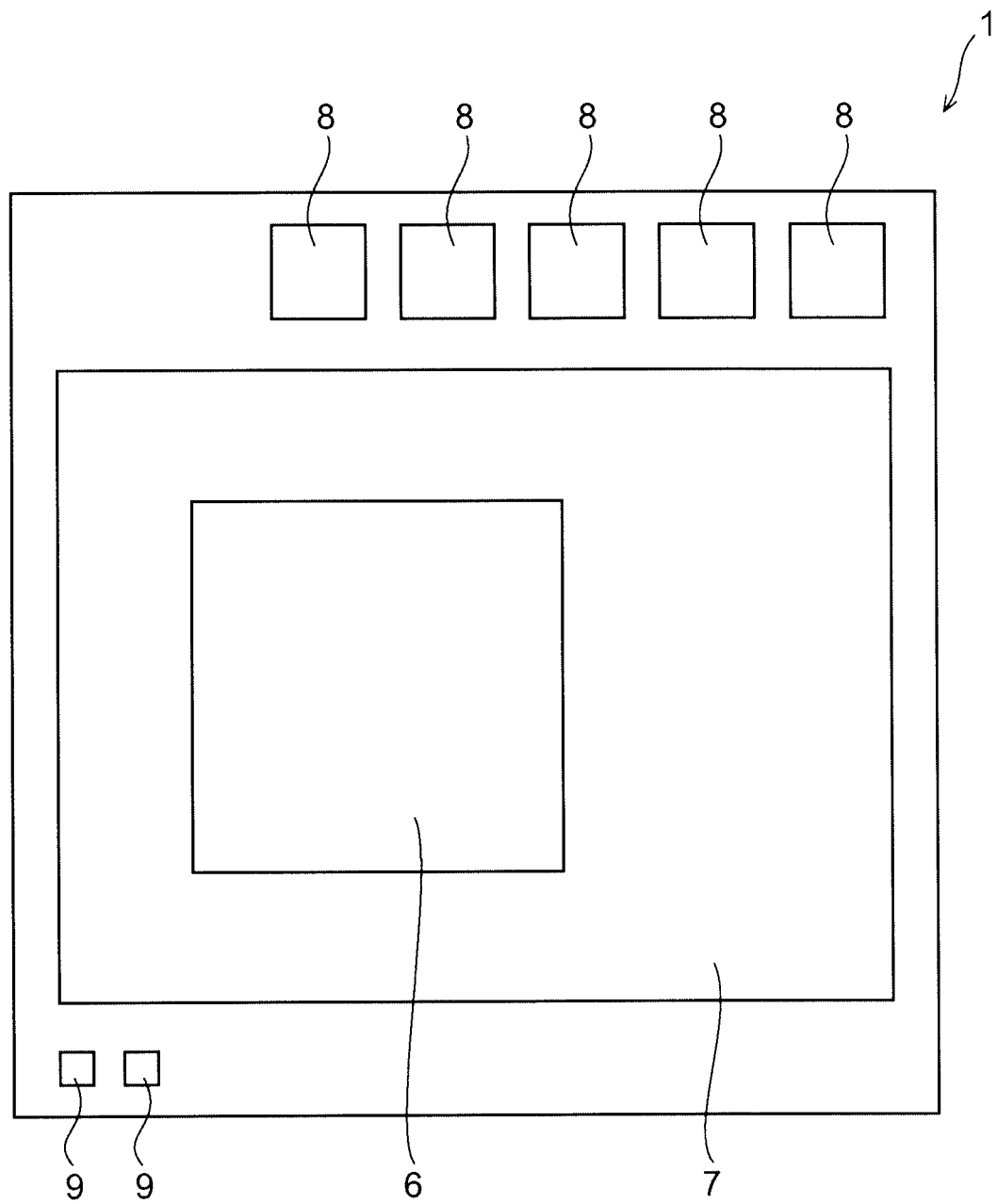
FIG. 1 is a plan view illustrating a solid state image capture device according to an embodiment.

In general, according to one embodiment, a solid state image capture device includes a multilayered interconnect layer, a semiconductor substrate, a pillar diffusion layer and an insulating member. The multilayered interconnect layer includes an interconnect. The semiconductor substrate is provided on the multilayered interconnect layer and the semiconductor substrate has a through-trench. The pillar diffusion layer is formed in the semiconductor substrate around the through-trench. In addition, an insulating member is filled into the through-trench.

According to another embodiment, a solid state image capture device includes a multilayered interconnect layer, a semiconductor substrate, a first pillar diffusion layer, a second pillar diffusion layer, an insulating member, an impurity diffusion region, an electrode pad, and a color filter. The multilayered interconnect layer includes an interconnect. The semiconductor substrate is provided on the multilayered interconnect layer and the semiconductor substrate has a first conductivity layer and first and second through-trenches. The first pillar diffusion layer is formed in the semiconductor substrate around the first through-trench and the first pillar diffusion layer is connected to the interconnect. The second pillar diffusion layer is formed in the semiconductor substrate around the second through-trench. The insulating member is filled into each of the first and second through-trenches. The impurity diffusion region of a second conductivity type partitions the first conductivity layer into a plurality of regions. The electrode pad is provided on the semiconductor substrate and is connected to the first pillar diffusion layer. In addition, the color filter is provided on the semiconductor substrate for each of the partitioned regions.

According to another embodiment, a method is disclosed for manufacturing a solid state image capture device. The method includes making first and second through-trenches to pierce a lower portion of a substrate. At least the lower portion of the substrate is made of a semiconductor material, and a first conductivity layer is provided in the lower portion of the substrate. The method includes forming a first pillar diffusion layer around the first through-trench and forming a second pillar diffusion layer around the second through-trench by implanting an impurity into side faces of the first and second through-trenches. The method includes forming an insulating member by filling an insulating material into an interior of each of the first and second through-trenches. The method includes forming an impurity diffusion region of a second conductivity type partitioning the first conductivity layer into a plurality of regions by implanting an impurity into a lower face of the substrate in a state of the insulating member filled into the second through-trench being identifiable. The method includes forming a multilayered interconnect layer including an interconnect below the substrate and connecting the interconnect to the first pillar diffusion layer. The method includes exposing the insulating member and the first and second pillar diffusion layers at an upper face of the lower portion of the substrate by removing an upper portion of the substrate. The method includes forming an electrode pad on the upper face of the lower portion of the substrate and connecting the electrode pad to the first pillar diffusion layer. In addition, the method includes forming a color filter above the upper face of the lower portion of the substrate for each of the partitioned regions in a state of the insulating member filled into the second through-trench being identifiable.

Embodiments of the invention will now be described.

First, distinctive portions of this embodiment will be described summarily.

A feature of a solid state image capture device according to this embodiment is that the solid state image capture device is a back-side illuminated solid state image capture device in which light is irradiated from above; a semiconductor substrate is provided on a multilayered interconnect layer; a color filter and the like are provided thereupon; multiple through-trenches are made in the semiconductor substrate; high-concentration pillar diffusion layers are formed around the through-trenches; and an insulating material is filled into the interiors of the through-trenches. A portion of the pillar diffusion layers formed around the through-trenches function as conducting members that connect the interconnects of the multilayered interconnect layer to an electrode pad provided on the semiconductor substrate; and the insulating member filled into the interiors of the remaining through-trenches functions as an alignment mark for positional alignment during the manufacturing. In such a case, the insulating member is identifiable from both faces of the semiconductor substrate because the through-trenches pierce the semiconductor substrate. The multiple through-trenches are made simultaneously.

The configuration of the solid state image capture device according to this embodiment will now be described in detail with reference to the drawings.

FIG. 1 is a plan view illustrating the solid state image capture device according to this embodiment.

Figure 2:
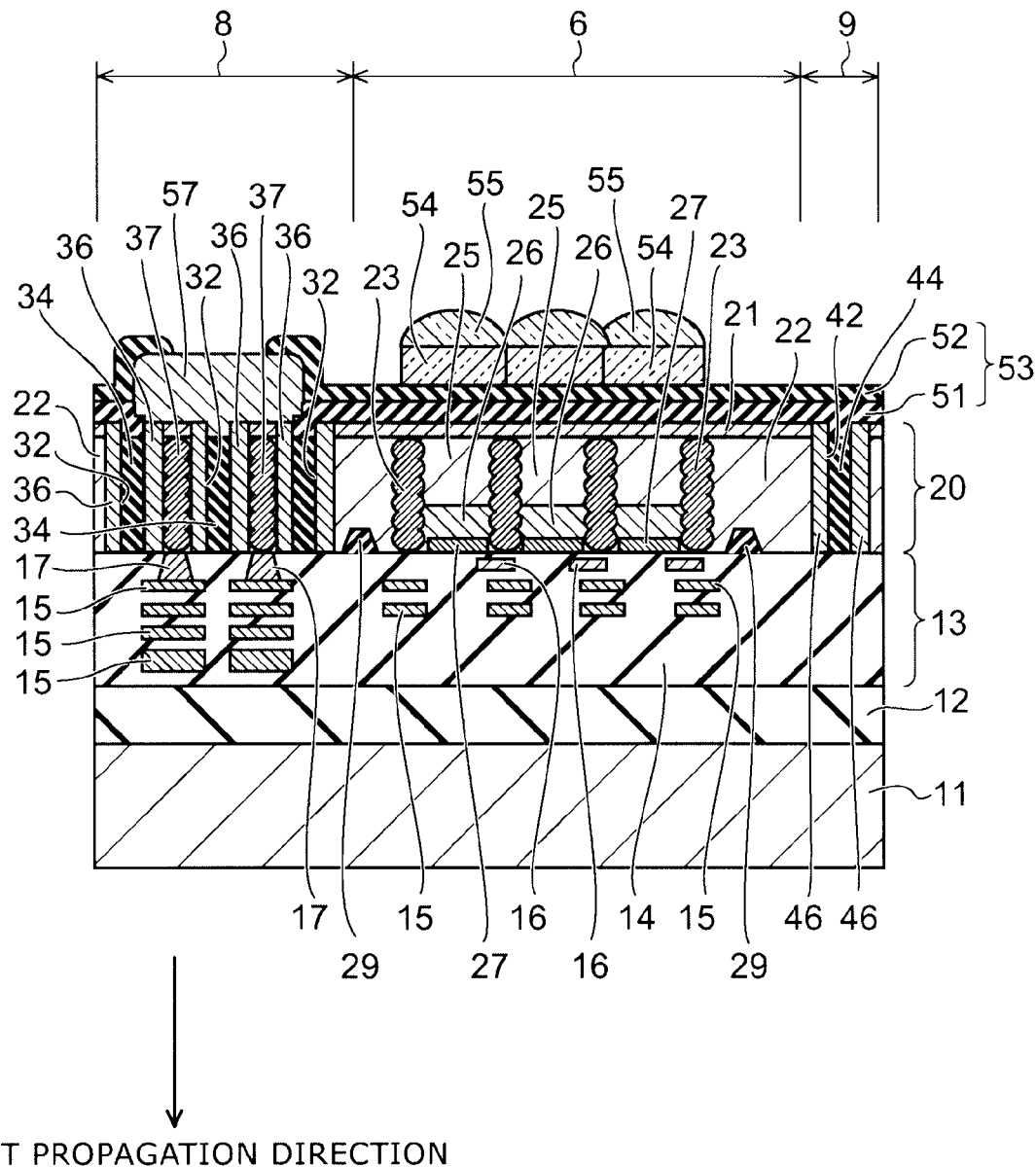
FIG. 2 is a cross-sectional view illustrating the solid state image capture device according to this embodiment.

FIG. 2 is a cross-sectional view illustrating the solid state image capture device according to this embodiment.

Figure 3A:
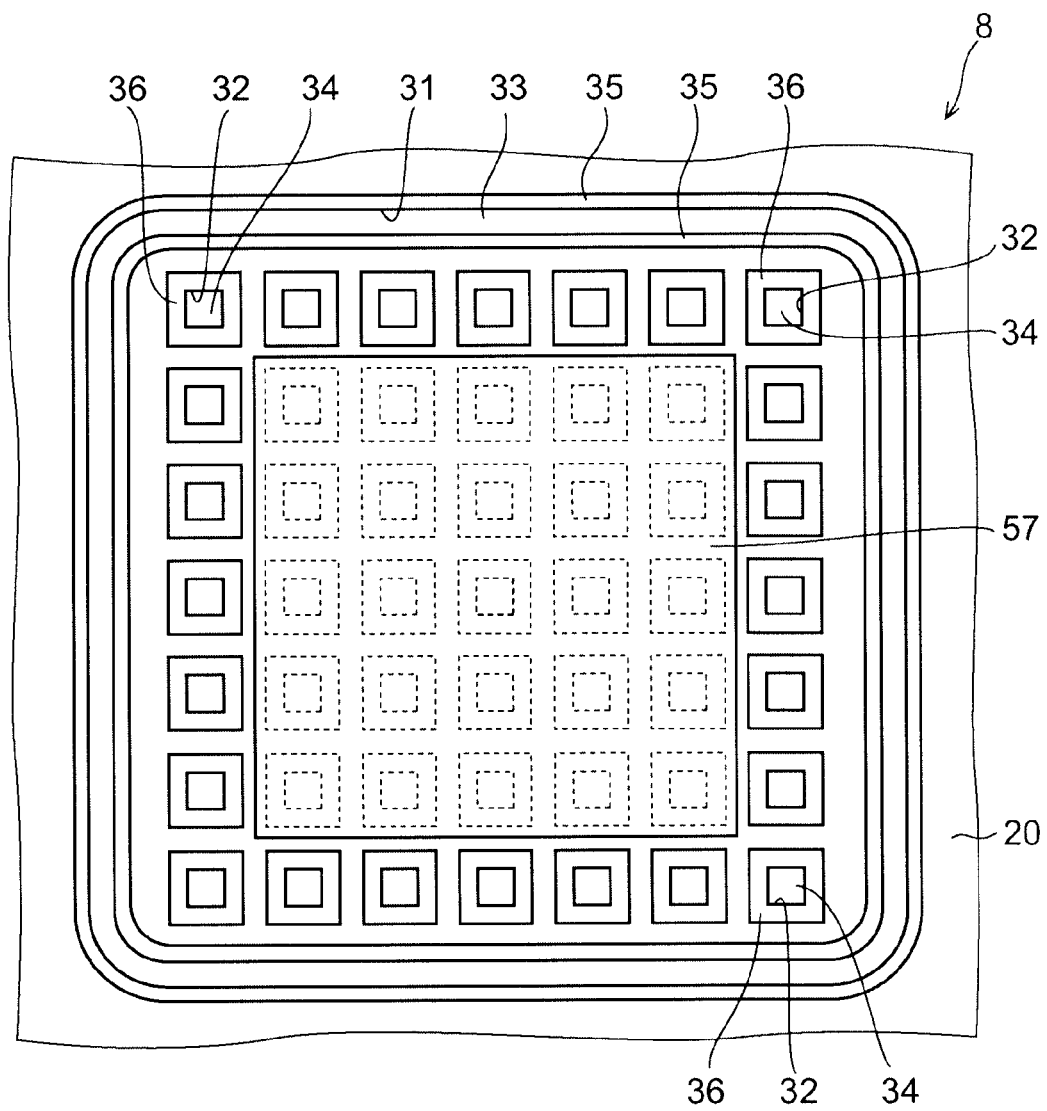
FIG. 3A is a plan view illustrating an electrode pad region of the solid state image capture device according to this embodiment.
Figure 3B:
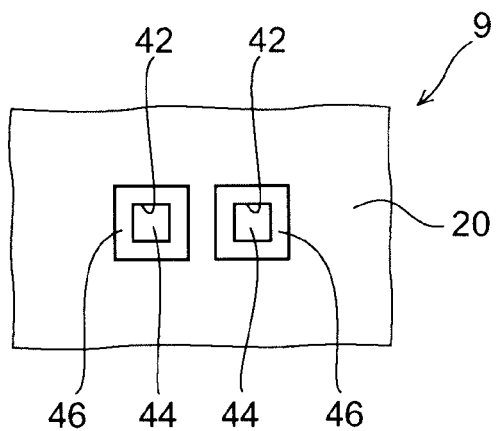
FIG. 3B is a plan view illustrating a mark material region.

FIG. 3A is a plan view illustrating an electrode pad region of the solid state image capture device according to this embodiment. FIG. 3B is a plan view illustrating a mark material region.

For easier viewing of the drawing in FIG. 2, only the distinctive portions are illustrated enlarged. Therefore, FIG. 2 is not matched strictly to FIG. 1 and FIGS. 3A and 3B.

Hereinbelow, in the description of the configuration of the solid state image capture device (referring to FIG. 1 to FIG. 3B), the average propagation direction of the light (the light propagation direction) when the solid state image capture device is capturing an image is taken as downward; the opposite direction is taken as upward; and directions orthogonal to upward and downward are taken as sideward. On the other hand, in the description of the method for manufacturing the solid state image capture device (referring to FIG. 4 to FIG. 27), the handling surface is taken as the lower face; the processing surface is taken as the upper face; and indications of downward and upward are matched thereto. Although indications of downward and upward are inverted in the description of the manufacturing method because the processing surface is inverted partway through the method for manufacturing the solid state image capture device according to this embodiment as described below, a reference thereof is provided in such cases.

As illustrated in FIG. 1, a light reception region 6 is provided in a solid state image capture device 1 to convert the received light into an electrical signal. The configuration of the outer edge of the light reception region 6 is rectangular as viewed from above. Many pixels are arranged in a matrix configuration in the light reception region 6. A peripheral circuit region 7 is provided around the light reception region 6 to drive the light reception region 6 and perform processing of the electrical signal output from the light reception region 6. The configuration of the outer edge of the peripheral circuit region 7 also is rectangular. One or multiple electrode pad regions 8 and one or multiple mark material regions 9 are provided in the solid state image capture device 1. The configurations of the electrode pad region 8 and the mark material region 9 are described below.

As illustrated in FIG. 2, a support substrate 11 is provided in the solid state image capture device 1 according to this embodiment. The support substrate 11 is formed of, for example, silicon and guarantees the strength and rigidity of the entire solid state image capture device 1. A passivation film 12 made of, for example, silicon oxide is provided on the support substrate 11; and a multilayered interconnect layer 13 is provided thereupon. In other words, the support substrate 11 is bonded over the lower face of the multilayered interconnect layer 13 via the passivation film 12.

In the multilayered interconnect layer 13, multiple layers of a metal interconnect 15 are provided in an inter-layer insulating film 14 made of an insulating material such as, for example, silicon oxide. In the light reception region 6, a transfer gate 16 is provided in the uppermost portion of the multilayered interconnect layer 13. In the electrode pad region 8, a contact 17 is provided in the uppermost portion of the multilayered interconnect layer 13. The contact 17 is connected to the metal interconnect 15 of the uppermost layer.

A semiconductor substrate 20 made of monocrystalline silicon is provided on the multilayered interconnect layer 13. A p-type layer 21 is formed in the uppermost layer of the semiconductor substrate 20; and an n-type layer 22 is formed in the semiconductor substrate 20 in the portions other than the p-type layer 21. A silicon oxide film 51 is provided on the upper face of the semiconductor substrate 20; and a silicon nitride film 52 is provided thereupon. The silicon oxide film 51 and the silicon nitride film 52 form an antireflective film 53.

In the light reception region 6, a p-type barrier region 23 is formed selectively in the n-type layer 22. The configuration of the p-type barrier region 23 as viewed from above is, for example, a lattice configuration. The p-type barrier region 23 partitions the semiconductor substrate 20 into multiple PD (photodiode) regions 25; and each of the PD regions 25 corresponds to a pixel of the solid state image capture device 1. The PD regions 25 are electrically separated from each other by the p-type layer 21 and the p-type barrier region 23. The configuration of the PD region 25 as viewed from above is, for example, substantially square; and the multiple PD regions 25 are arranged in a matrix configuration.

A high-concentration region 26 of an $n^+$-type conductivity type is formed in a lower portion of the PD region 25. The n-type layer 22 remains as-is in the upper portion of the PD region 25. An inversion preventing layer 27 of the p-type conductivity type is formed on the lowermost layer portion of the PD region 25. Thus, the PD region 25 is formed of the high-concentration region 26 and the n-type layer 22; and the PD region 25 is surrounded by the p-type layer 21, the p-type barrier region 23, and the inversion preventing layer 27. An impurity forming a donor, e.g., phosphorus (P), is introduced into the high-concentration region 26 and the n-type layer 22. An impurity forming an acceptor, e.g., boron (B), is introduced into the p-type layer 21, the p-type barrier region 23, and the inversion preventing layer 27. An STI 29 is formed in the lower face of the semiconductor substrate 20 to surround the light reception region 6. On the other hand, in the peripheral circuit region 7, a readout circuit (not illustrated) and the like are formed in the lower face of the semiconductor substrate 20.

In the light reception region 6, multiple color filters 54 are provided on the antireflective film 53. The color filter 54 is provided for each of the PD regions 25 in, for example, a region directly above each of the PD regions 25. In such a case, the boundary between adjacent color filters 54 is positioned in a region directly above the p-type barrier region 23. The color filters 54 include, for example, a red filter that transmits red light and blocks light of other colors; a green filter that transmits green light and blocks light of other colors; and a blue filter that transmits blue light and blocks light of other colors. A plano-convex microlens 55 is provided on each of the color filters 54. Thus, one of each of the microlens 55, the color filter 54, and the PD region 25 are provided in this order from above in each of the pixels of the solid state image capture device 1. The transfer gate 16 described above also is provided for each of the pixels. Amplifier/reset transistors (not illustrated) also are formed for each of the pixels.

As illustrated in FIG. 2 and FIG. 3A, a through-trench 31 is made in each of the electrode pad regions 8 in a frame-like configuration along the outer edge of the electrode pad region 8. The antireflective film 53 is not illustrated in FIGS. 3A and 3B. The configuration of the through-trench 31 as viewed from above is, for example, substantially square with a side length of 80 μm and with rounded corners. Multiple through-trenches 32 having dot configurations are made in the region surrounded by the through-trench 31. The configuration of each of the through-trenches 32 as viewed from above is, for example, a square with a side length of 0.5 μm. The through-trenches 32 are arranged in a matrix configuration; and the distance between the through-trenches 32 is, for example, 0.8 μm. Although the example is illustrated in FIG. 3A in which forty-nine through-trenches 32 are arranged in seven rows by seven columns inside one through-trench 31, more through-trenches 32 may be arranged. The through-trenches 31 and 32 pierce the semiconductor substrate 20.

An insulating material, e.g., insulating members 33 and 34 made of silicon oxide, is filled into the interiors of the through-trenches 31 and 32. The insulating member 33 has a frame-like configuration; and the insulating member 34 has a quadrilateral columnar configuration. The insulating members 33 and 34 pierce the semiconductor substrate 20. The pillar diffusion layer 35 is formed in the semiconductor substrate 20 around the through-trench 31 along the inner face of the through-trench 31. A pillar diffusion layer 36 is formed in the semiconductor substrate 20 around the through-trench 32 along the inner face of the through-trench 32. The pillar diffusion layers 35 and 36 are formed to surround the insulating members 33 and 34, respectively, and pierce the semiconductor substrate 20. The pillar diffusion layer 35 has a quadrilateral columnar cylindrical configuration because the insulating member 34 has a quadrilateral columnar configuration as described above. An impurity forming an acceptor, e.g., boron (B), is introduced into the pillar diffusion layers 35 and 36; the conductivity type of the pillar diffusion layers 35 and 36 is the p-type; and the effective impurity concentration thereof is higher than the effective impurity concentration of the semiconductor substrate 20. The effective impurity concentration is the concentration of the impurities contributing to the electrical conduction, i.e., all of the activated impurities excluding the portion of the donors (the n-type impurities) cancelling with the acceptors (the p-type impurities). For example, the effective impurity concentration of the pillar diffusion layers 35 and 36 is about $1\times10^{12}$ $cm^{-3}$; and the effective impurity concentration of the semiconductor substrate 20 is about $1\times10^{12}$ $cm^{-3}$.

A p-type conducting region 37 is formed in the semiconductor substrate 20 in the portion between the pillar diffusion layers 36. The p-type conducting region 37 is formed simultaneously with the p-type barrier region 23; and the configuration thereof as viewed from above is a lattice configuration partitioning each of the through-trenches 32. Thereby, the portion of the semiconductor substrate 20 between the through-trenches 32, i.e., the remaining silicon portion, forms a high-concentration p-type region having an effective impurity concentration higher than that of the other portions of the semiconductor substrate 20. The pillar diffusion layer 36 and the p-type conducting region 37 are connected to the contact 17 of the multilayered interconnect layer 13.

In each of the electrode pad regions 8, an electrode pad 57 made of metal is provided on the semiconductor substrate 20. The configuration of the electrode pad 57 as viewed from above is, for example, square. The silicon nitride film 52 (referring to FIG. 2) covers the end portions of the electrode pad 57. The electrode pad 57 is a region surrounded by the through-trench 31 having the frame-like configuration, is disposed in the region directly above at least a portion of the through-trenches 32, is in contact with at least a portion of the pillar diffusion layers 36 and at least a portion of the p-type conducting regions 37, and is connected to the same. Thereby, in the electrode pad region 8, the metal interconnect 15 formed in the multilayered interconnect layer 13 is connected to the electrode pad 57 via the pillar diffusion layer 36 and the p-type conducting region 37 formed in the semiconductor substrate 20. In the example illustrated in FIG. 3A, a positional alignment margin when forming the electrode pad 57 is ensured by isolating the electrode pad 57 from the through-trench 31 having the frame-like configuration.

As illustrated in FIG. 2 and FIG. 3B, a through-trench 42 is made in the semiconductor substrate 20 in the mark material region 9. An insulating member 44 made of, for example, an insulating material such as silicon oxide is filled into the interior of the through-trench 42. The insulating member 44 functions as an alignment mark for the positional alignment during the manufacturing processes such as the lithography process, the inspection process, etc., of the solid state image capture device 1. A pillar diffusion layer 46 is formed in the semiconductor substrate 20 around the through-trench 42. As described below, the through-trenches 31, 32, and 42 are made simultaneously with each other; the pillar diffusion layers 35, 36, and 46 are formed simultaneously with each other; and the insulating members 33, 34, and 44 are filled simultaneously with each other. The configuration of the insulating member 44 as viewed from above may be the same as the configuration of the insulating member 34 or may be different therefrom.

A method for manufacturing the solid state image capture device according to this embodiment will now be described.

FIG. 4 to FIG. 27 are cross-sectional views of processes, illustrating the method for manufacturing the solid state image capture device according to this embodiment.

Figure 10:
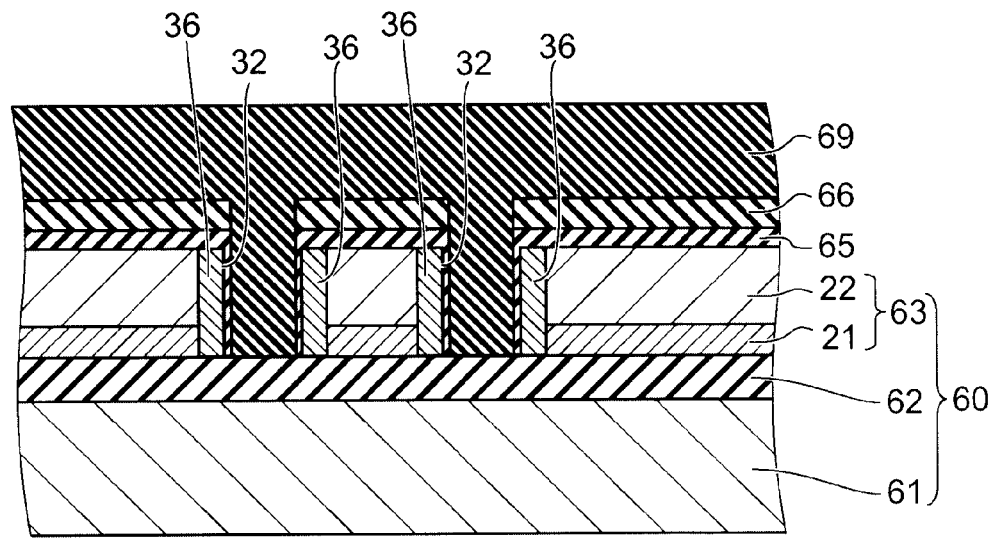
Figure 11:
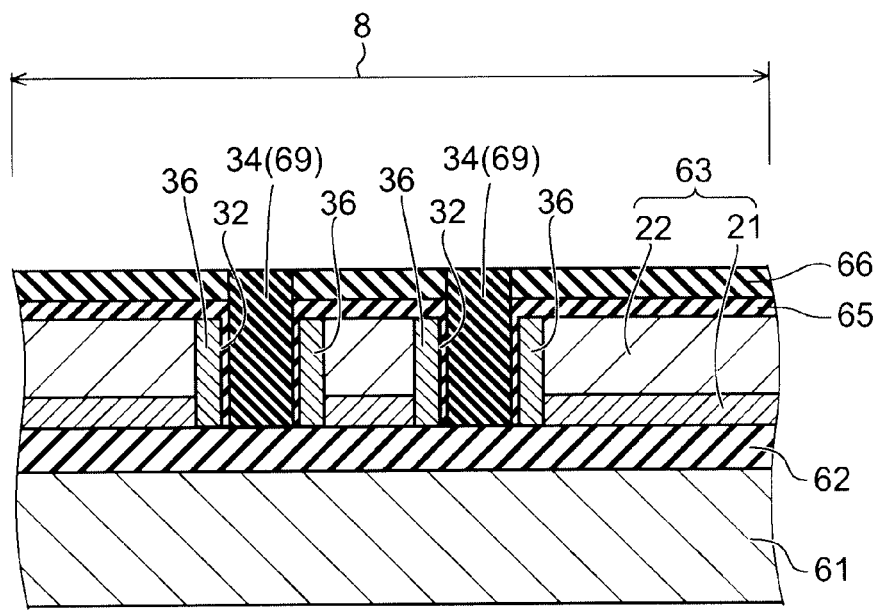
Figure 12:
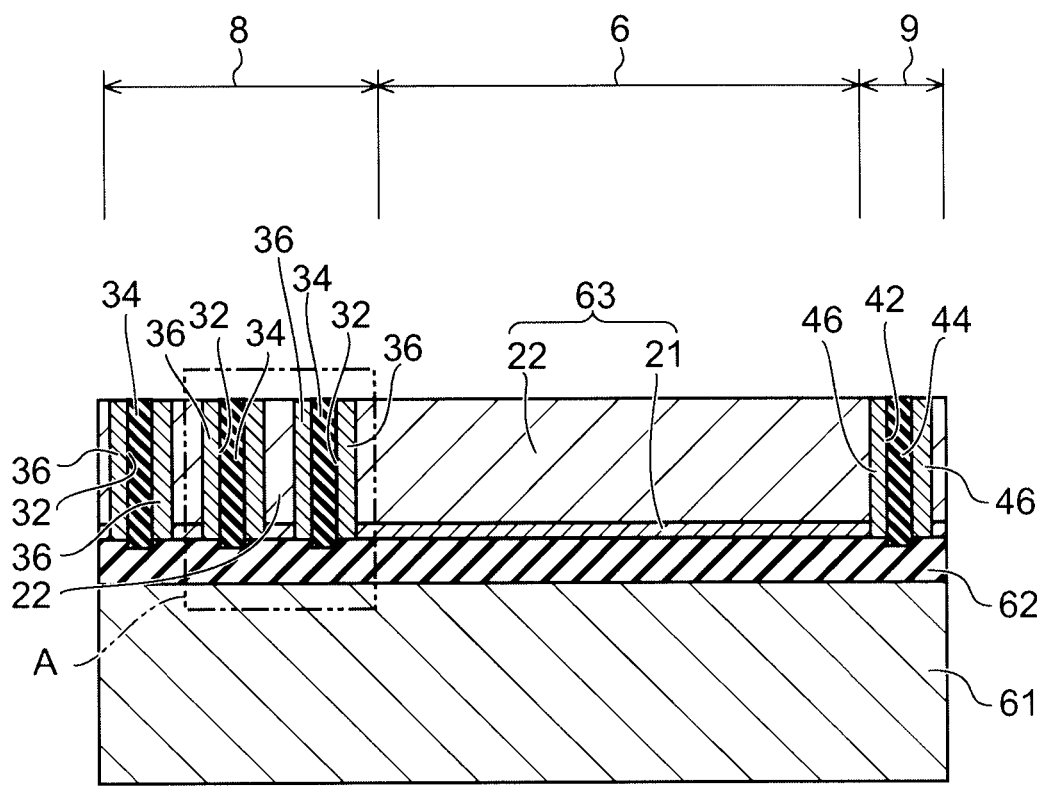

FIG. 4 to FIG. 11 illustrate only the electrode pad region and illustrate the region A of FIG. 12. FIG. 12, FIG. 13, and FIG. 15 to FIG. 27 illustrate the same cross section as FIG. 2. FIG. 14 illustrates the region B of FIG. 13. FIG. 4 to FIG. 15 are vertically inverted with respect to FIG. 2. Similarly to FIG. 2, only the distinctive portions are illustrated enlarged in FIG. 4 to FIG. 27.

Figure 4:
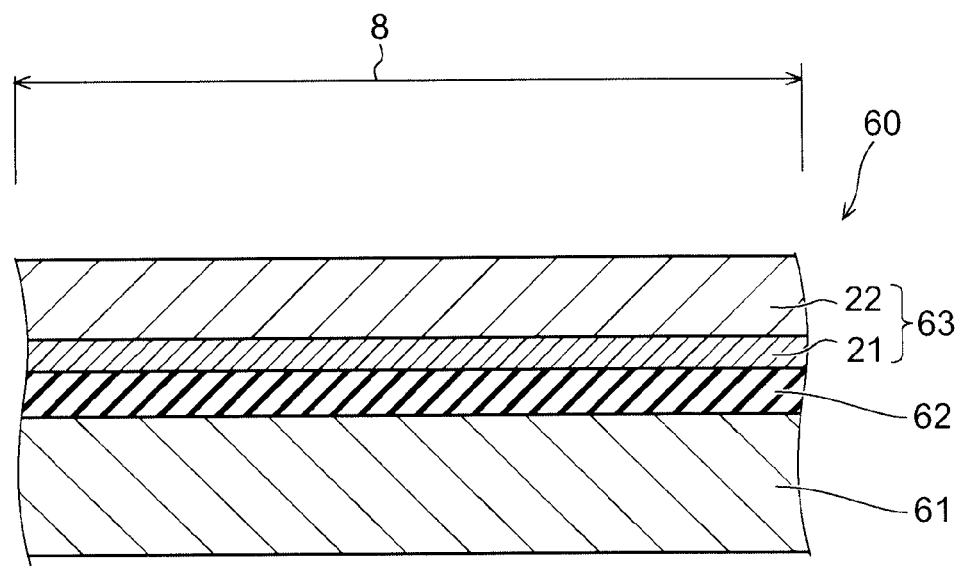
FIG. 4 to FIG. 27 are cross-sectional views of processes illustrating a method for manufacturing the solid state image capture device according to this embodiment.

First, as illustrated in FIG. 4, an SOI (silicon on insulator) substrate 60 is prepared. A base material 61, a BOX oxide film 62, and a silicon layer 63 are provided in this order from the lower side in the SOI substrate 60.

Hereinbelow, in the description of the processes illustrated in FIG. 4 to FIG. 15, the base material 61 side is taken as the handling surface; and the silicon layer 63 side is taken as the processing surface. Therefore, the base material 61 side is taken as downward; and the silicon layer 63 side is taken as upward. Although light for image capturing is not incident during the manufacturing of the solid state image capture device 1, the arrow indicating the light propagation direction as in FIG. 2 also is illustrated in FIG. 4 to FIG. 27 for convenience. The light propagation direction is fixed for the solid state image capture device 1 and the intermediate products thereof.

The base material 61 is made of monocrystalline silicon and is of the p-type conductivity type. The BOX oxide film 62 is made of silicon oxide and has a film thickness of, for example, 145 nm. The silicon layer 63 is made of monocrystalline silicon and has a film thickness of, for example, 3.7 µm. The lower portion of the silicon layer 63 has a film thickness of, for example, 0.2 µm and forms the p-type layer 21 of the p-type conductivity type; and the upper portion of the silicon layer 63 has a film thickness of, for example, 3.5 µm and forms the n-type layer 22 of the n-type conductivity type. The silicon layer 63 is the portion that forms the semiconductor substrate 20 in the solid state image capture device 1 after completion. Although the light propagation direction is taken as upward in FIG. 4, in the case where the light propagation direction is taken as downward, the silicon layer 63 corresponds to the lower portion of the SOI substrate 60.

Figure 5:
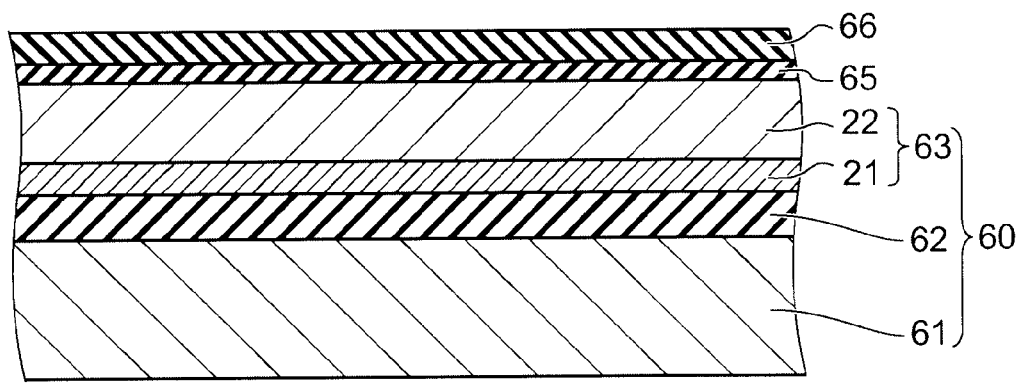

As illustrated in FIG. 5, thermal oxidation treatment is performed on the SOI substrate 60 to form a silicon oxide film 65 with a thickness of, for example, 5 nm on the n-type layer 22. Then, a silicon nitride film 66 is formed with a thickness of, for example, 100 nm by CVD (chemical vapor deposition).

Figure 6:
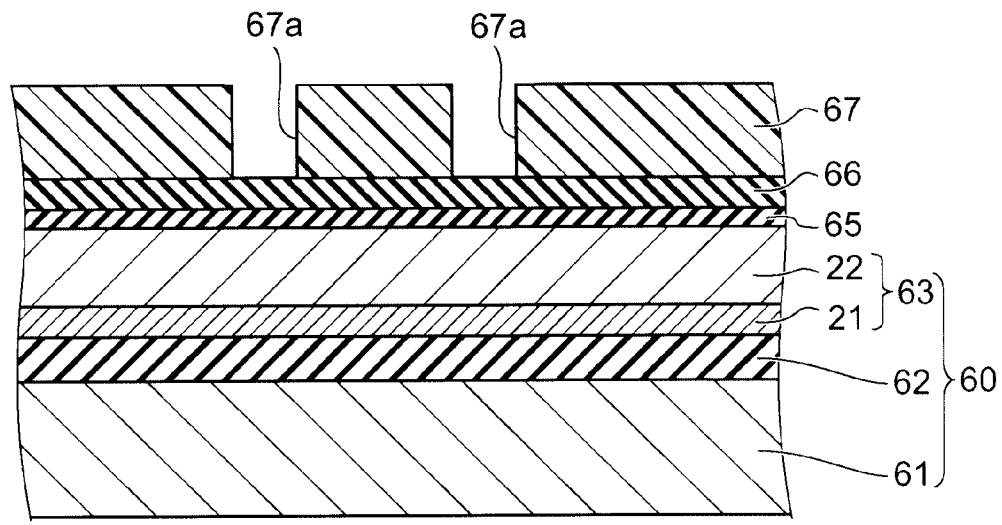

Continuing as illustrated in FIG. 6, a photoresist film 67 is formed on the silicon nitride film 66; and exposing and developing are performed to make openings 67a in regions where the through-trenches 31, 32, and 42 (referring to FIGS. 3A and 3B) are to be made. At this time, for example, the width of each of the openings 67a is set to 0.4 µm; and the remaining width between the openings 67a is set to 0.8 µm.

Figure 7:
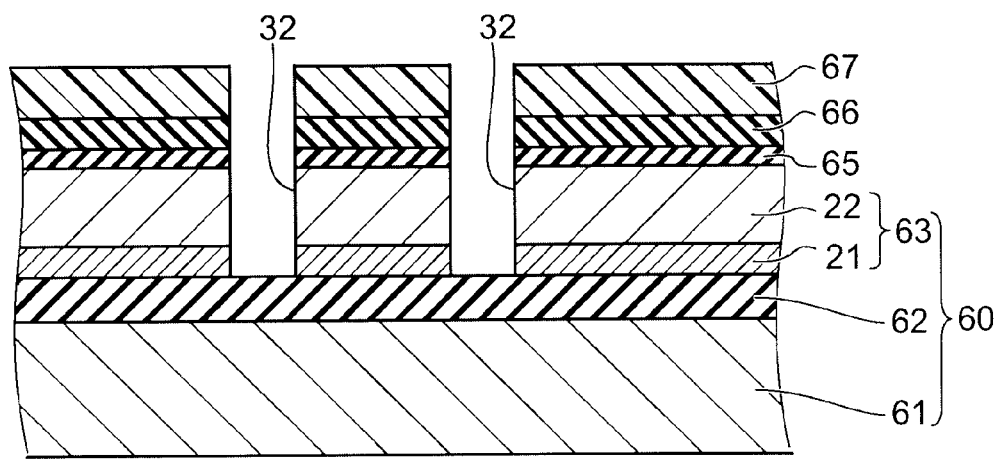

Then, as illustrated in FIG. 7, dry etching is performed using the photoresist film 67 as a mask and the BOX oxide film 62 as a stopper to selectively remove the silicon nitride film 66, the silicon oxide film 65, and the silicon layer 63. Thereby, the through-trenches 31 (referring to FIG. 3A), 32, and 42 (referring to FIG. 3B) (hereinbelow also generally referred to as the through-trenches 32, etc.) are made in the silicon layer 63 to pierce the silicon layer 63. Although the through-trenches 32, etc., pierce the silicon layer 63 and reach the BOX oxide film 62, the through-trenches 32, etc., do not pierce the BOX oxide film 62. Subsequently, the photoresist film 67 is removed by performing dry processing with oxygen plasma and wet processing with an aqueous sulfuric acid solution.

Figure 8:
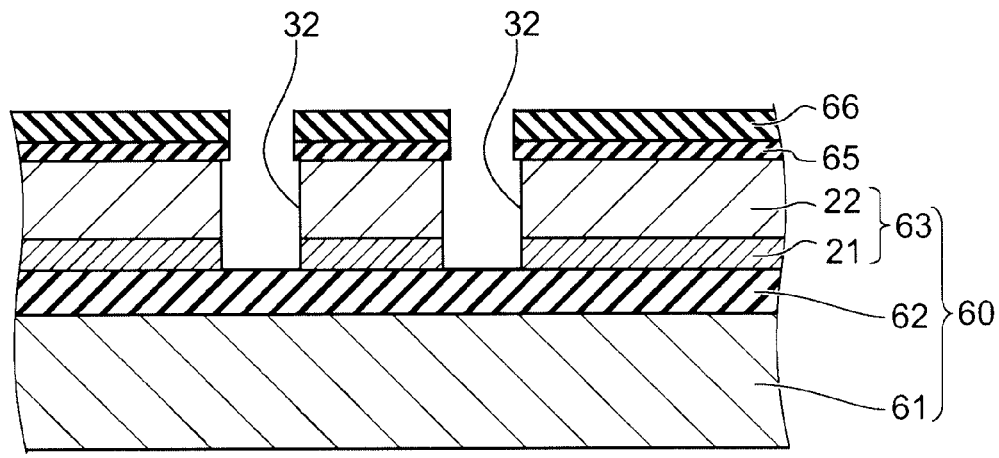
Figure 8:

Then, CDE (Chemical Dry Etching) is performed as illustrated in FIG. 8. Thereby, each of the side faces of the through-trenches 32, etc., is etched back about 10 nm. At this time, the silicon nitride film 66 is not etched; the silicon oxide film 65 is protected by the silicon nitride film 66 and therefore is not etched; and only the silicon layer 63 exposed at the side faces of the through-trenches 32, etc., is recessed. As a result, at the upper end portions of the through-trenches 32, etc., the silicon oxide film 65 and the silicon nitride film 66 relatively jut toward the central portions of the through-trenches 32, etc., and have eave-like configurations.

Figure 9:
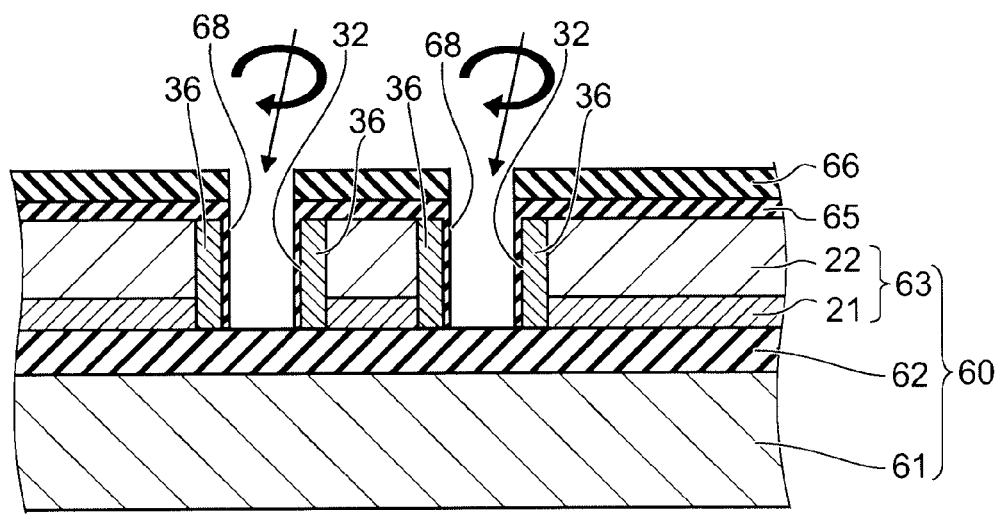
Figure 9:

Continuing as illustrated in FIG. 9, thermal oxidation treatment is performed to form a silicon oxide film 68 with a thickness of, for example, 5 nm on each of the side faces of the through-trenches 32, etc. Then, an impurity such as boron (B) is ion implanted. At this time, the impurity is implanted while rotating the SOI substrate 60. The implantation direction of the impurity is tilted 5 degrees with respect to the downward direction. In other words, a tilt angle of 5 degrees is used. The acceleration voltage is set to, for example, 15 keV; and the implantation amount is set to, for example, $5 \times 10^{15}$ cm$^{-2}$. Thereby, the pillar diffusion layer 35 (referring to FIG. 3A) is formed on the inner wall of the through-trench 31; the pillar diffusion layer 36 is formed on the inner wall of the through-trench 32; and the pillar diffusion layer 46 (referring to FIG. 3B) is formed on the inner wall of the through-trench 42.

At this time, high-concentration boron is not ion implanted into the shoulder-like regions of the through-trenches 32, etc., because the upper layer portion of the silicon layer 63 is protected by the silicon nitride film 66. This is because, while the film thickness of the silicon nitride film 66 is 100 nm, the peak penetration distance into the silicon nitride film when implanting boron with an acceleration voltage of 15 keV is 38.2 nm; the maximum penetration distance is 73.6 nm even when allowing for twice the spread width ($\Delta Rp$) of 17.7 nm; and the silicon nitride film 66 is not pierced. Therefore, boron is not implanted concentratively into the shoulder-like region of the through-trenches. Accordingly, boron is not emitted during the subsequent oxidation treatment; and the oxidation oven is not contaminated.

Then, as illustrated in FIG. 10, a silicon oxide film 69 is formed by depositing silicon oxide with LP-CVD (low pressure chemical vapor deposition). At this time, the amount of the deposited silicon oxide is set to reliably fill the interiors of the through-trenches 32, etc. For example, in the case where the opening widths of the through-trenches 32, etc., are set to 0.4 μm, the amount of the deposited silicon oxide is set to 0.3 μm. Thereby, the silicon oxide film 69 is filled also into the interiors of the through-trenches 32, etc.

Continuing as illustrated in FIG. 11, CMP (chemical mechanical polishing) is performed using the silicon nitride film 66 as a stopper to remove the silicon oxide film 69 from the silicon nitride film 66 and leave the silicon oxide film 69 only in the interiors of the through-trenches 32, etc. Thereby, the insulating members 33 (referring to FIG. 3A), 34, and 44 (referring to FIG. 3B) made of silicon oxide are buried in the interiors of the through-trenches 31, 32, and 42, respectively. Subsequently, hot phosphoric acid treatment is performed to remove the silicon nitride film 66.

Thus, as illustrated in FIG. 12, the through-trenches 31 and 32, the pillar diffusion layers 34 and 36, and the insulating members 33 and 34 are formed in the electrode pad region 8; and the through-trench 42, the pillar diffusion layer 46, and the insulating member 44 are formed in the mark material region 9. Because the insulating member 44 is formed of silicon oxide, the insulating member 44 has a high contrast with the silicon layer 63 made of silicon when observed by an electron microscope; and the insulating member 44 can be easily recognized. Thereby, the insulating member 44 is identifiable from the processing surface side at this stage. Therefore, the insulating member 44 can be utilized as an alignment mark. The region illustrated in FIG. 4 to FIG. 11 corresponds to the region A illustrated in FIG. 12.

Figure 13:
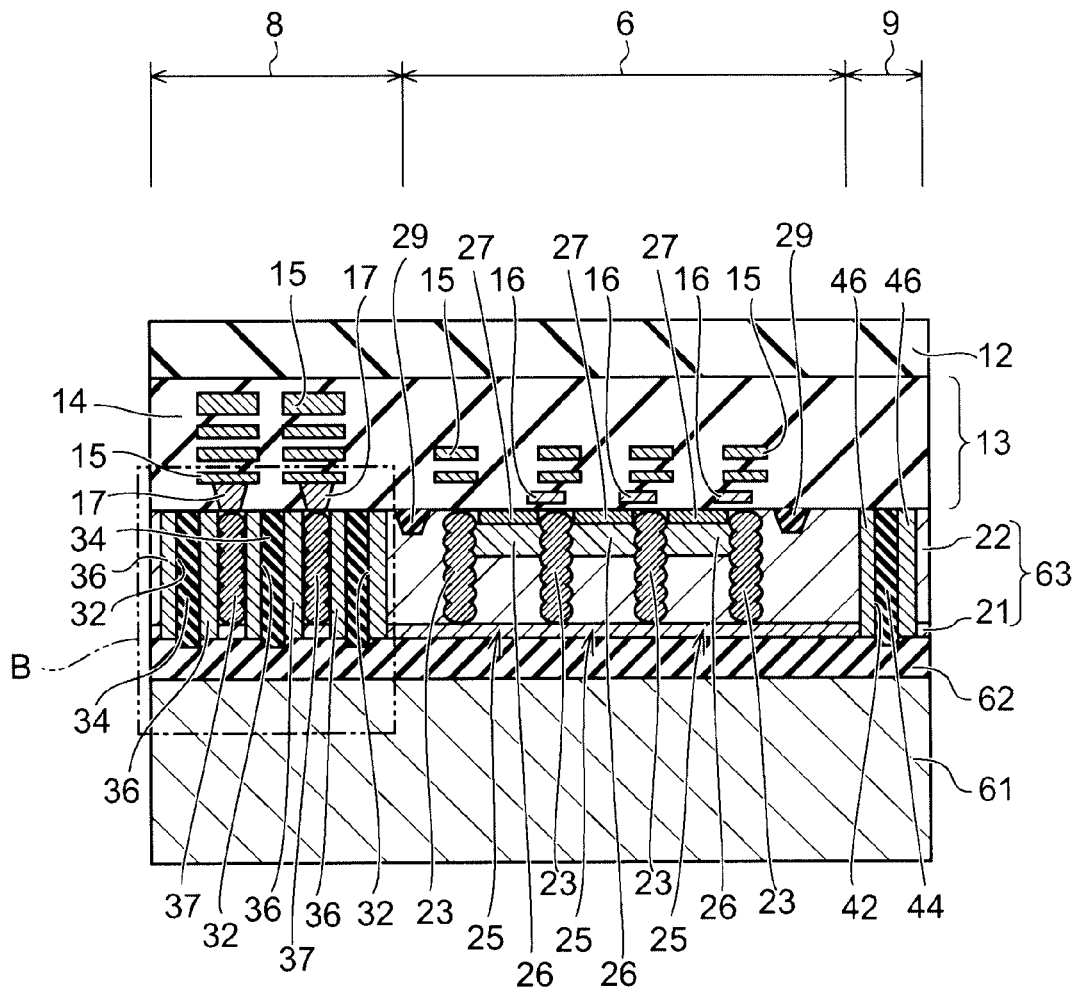
Figure 14:
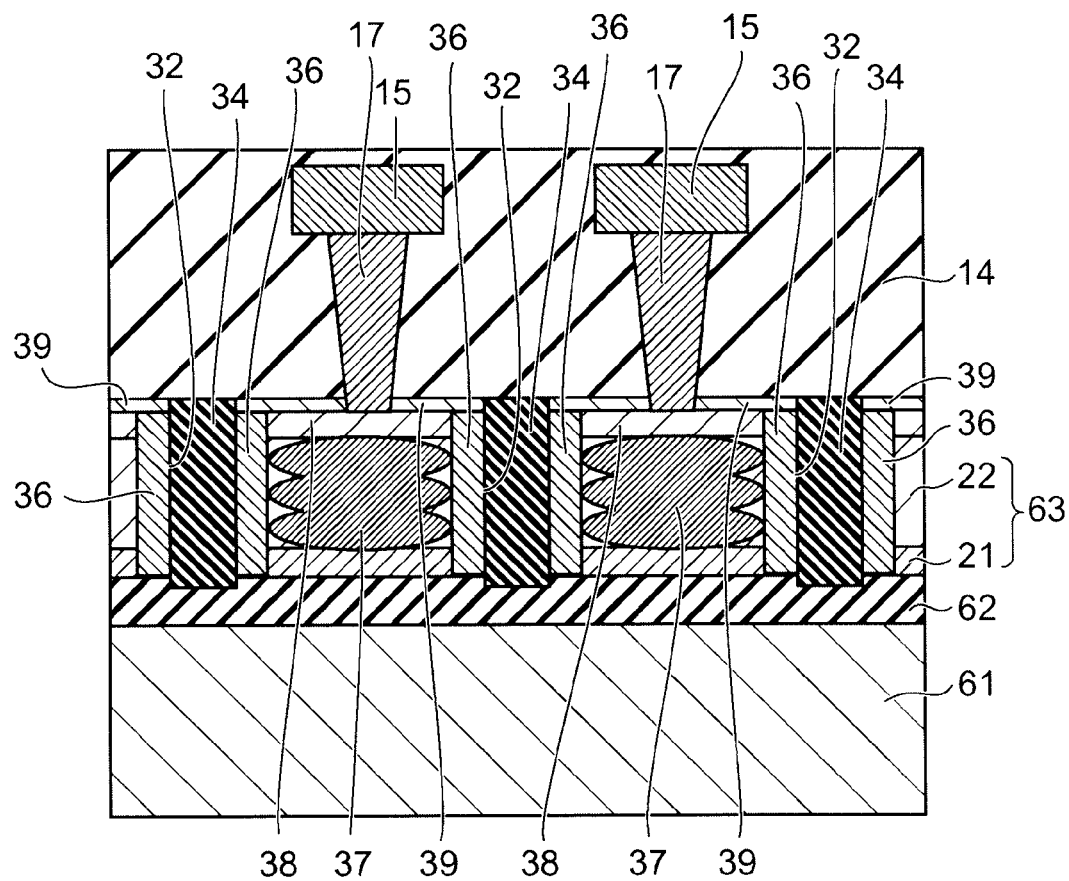

Then, as illustrated in FIG. 13, the components of the light reception region 6 and the peripheral circuit region 7 (referring to FIG. 1) are formed in the interior of the silicon layer 63 using the insulating member 44 as an alignment mark. The multilayered interconnect layer 13 is formed on the SOI substrate 60. Specifically, the STI 29 is formed on the upper face of the silicon layer 63 using the insulating member 44 as an alignment mark. Then, boron is ion implanted into the n-type layer 22 using the insulating member 44 as an alignment mark to form the p-type barrier region 23 in a lattice configuration in the light reception region 6 and form the p-type conducting region 37 in a lattice configuration in the electrode pad region 8. At this time, the p-type barrier region 23 and the p-type conducting region 37 are formed in contact with the p-type layer 21. The p-type barrier region 23 is formed to partition the silicon layer 63 into multiple PD regions 25; and the p-type conducting region 37 is formed in the region between the pillar diffusion layers 36.

Then, the transfer gate 16 is formed for each of the pixel regions using the insulating member 44 as an alignment mark. Then, the high-concentration region 26 is formed by ion implanting an impurity forming a donor into the upper portion of the silicon layer 63 in the light reception region 6. At this time, the portion below the high-concentration region 26 in each of the portions partitioned by the p-type barrier region 23 remains as the n-type layer 22. Then, the inversion preventing layer 27 is formed by implanting an impurity forming an acceptor into the uppermost layer portion of the silicon layer 63 in the light reception region 6. Thereby, each of the portions partitioned by the p-type barrier region 23 forms the photodiode (PD) region 25.

Continuing, in the electrode pad region 8, the contact 17 is formed on the silicon layer 63 using the insulating member 44 as an alignment mark. The contact 17 is connected to the pillar diffusion layer 36 and the p-type conducting region 37. Then, the multilayered interconnect layer 13 is formed by depositing the inter-layer insulating film 14 to bury the transfer gate 16 and the contact 17 and by forming the metal interconnect 15 in the inter-layer insulating film 14.

During the processes of forming the diffusion layers in the silicon layer 63 and forming the multilayered interconnect layer 13 described above, amplifier transistors, reset transistors, and the like (not illustrated) are formed in the light reception region 6. A readout circuit (not illustrated), and the like are formed in the peripheral circuit region 7. Then, silicon oxide is deposited on the multilayered interconnect layer 13; the passivation film 12 is formed; and the upper face is planarized by CMP.

FIG. 14 is a partially enlarged cross-sectional view of the enlarged region B of FIG. 13 at this stage. In the silicon layer 63 as illustrated in FIG. 14, the insulating member 34 made of an insulating material is filled into the through-trench 32; and the p-type pillar diffusion layer 36 is formed around the through-trench 32. The p-type conducting region 37 is formed in the portion of the n-type layer 22 between the pillar diffusion layers 36; and the conductivity type of this portion is inverted to the p-type. A high-concentration p-type diffusion layer 38 is formed in the uppermost layer portion of the silicon layer 63 when the peripheral circuit is formed; and a salicide layer 39, in which silicon is alloyed, is formed thereupon. The p-type diffusion layer 38 and the salicide layer 39 are not illustrated in the other drawings. The multilayered interconnect layer 13 is provided on the salicide layer 39; and the metal interconnect 15 and the contact 17 made of metal are provided in the multilayered interconnect layer 13. The lower end of the contact 17 is connected to the salicide layer 39; and the upper end is connected to the lowermost metal interconnect 15 layer.

Figure 15:
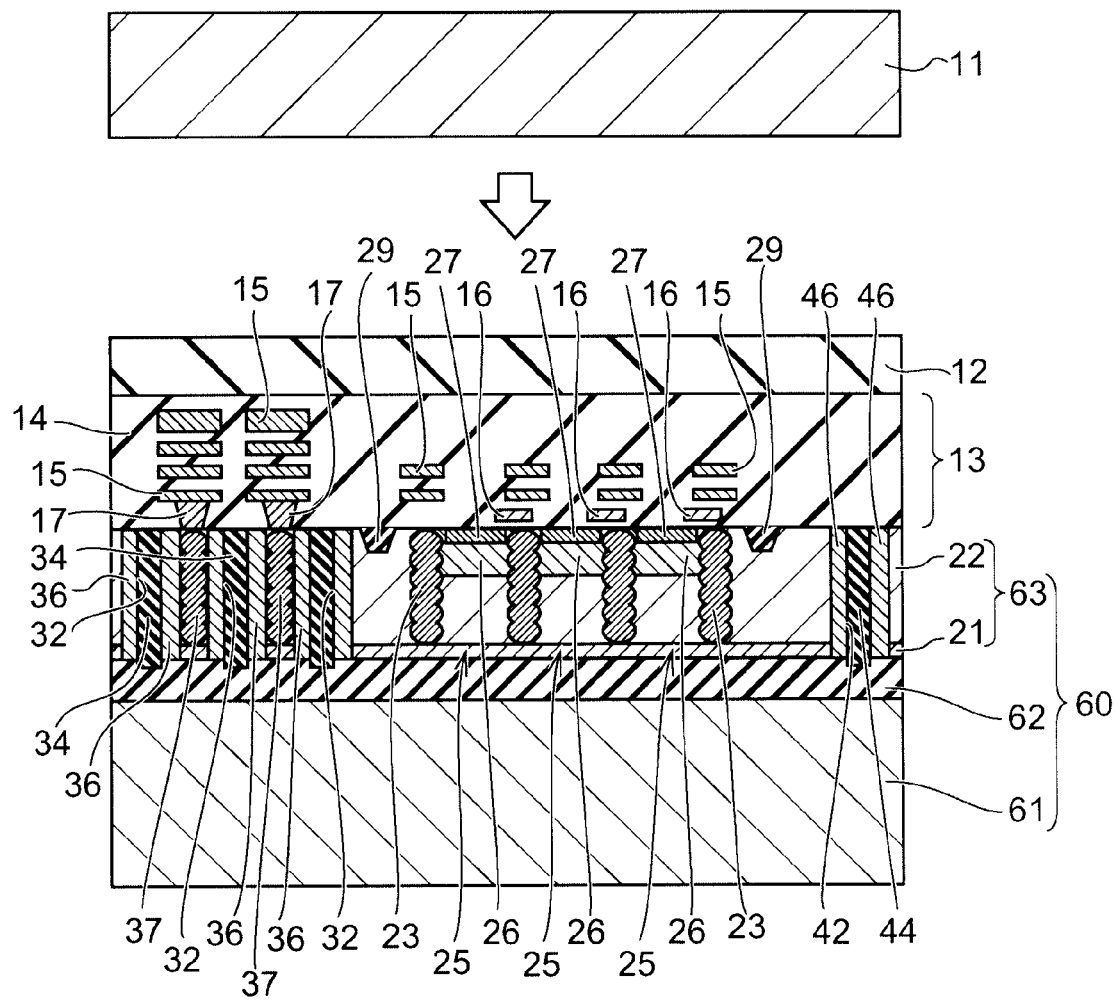

Then, as illustrated in FIG. 15, the support substrate 11 is adhered to the upper face of the passivation film 12. In other words, the support substrate 11 is bonded over the upper face of the multilayered interconnect layer 13 via the passivation film 12. The support substrate 11 is, for example, a silicon wafer. In the processes hereinbelow, the support substrate 11 side is taken as the handling surface. Therefore, in FIG. 16 to FIG. 27, the vertical directions are once again inverted and are the same as those of FIG. 2. The vertical directions in the following description are matched to FIG. 16 to FIG. 27.

Figure 16:
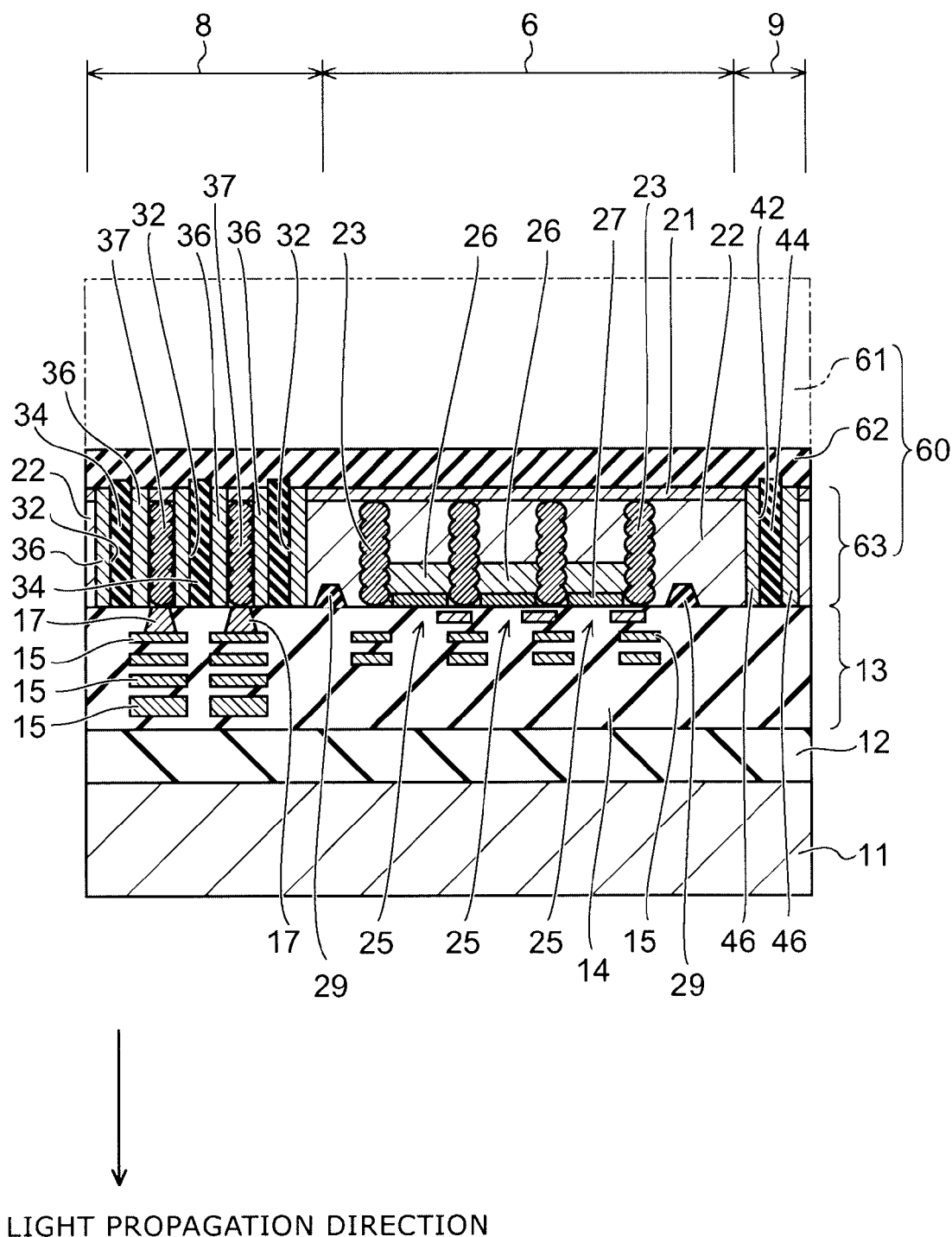

Continuing as illustrated in FIG. 16, the base material 61 of the SOI substrate 60 is removed by polishing using the BOX oxide film 62 as a stopper.

Figure 17:
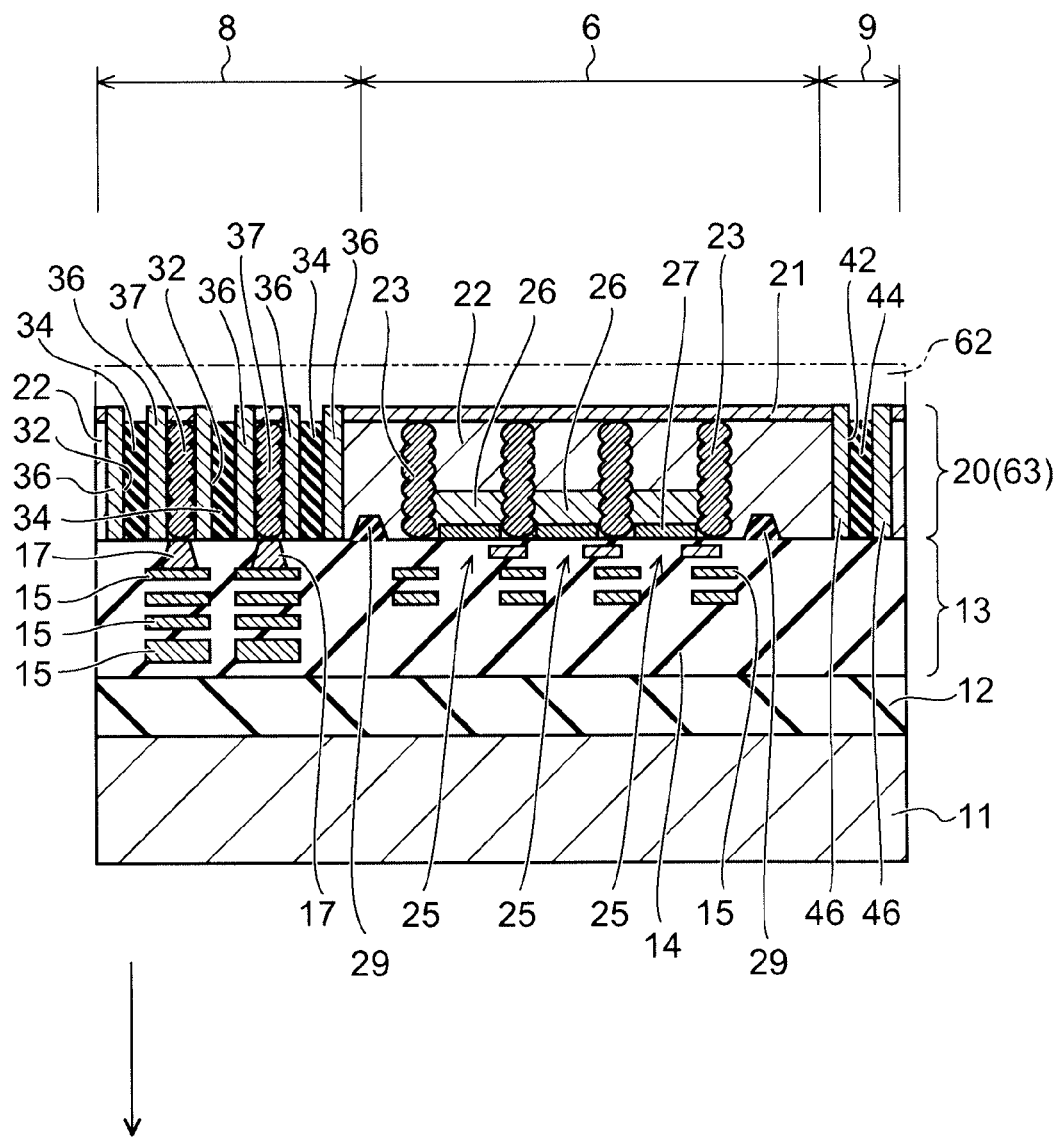

Then, as illustrated in FIG. 17, the BOX oxide film 62 is removed by dissolving with a hydrofluoric acid solution. At this time, the remaining silicon layer 63 forms the semiconductor substrate 20. Thereby, the insulating members 33, 34, and 44 and the pillar diffusion layers 35, 36, and 46 are exposed at the upper face of the semiconductor substrate 20. The upper portions of the insulating members 33, 34, and 44 are removed to recess the upper faces to make recesses at portions corresponding to the through-trenches 31, 32, and 42. At this time, the etching amount due to the hydrofluoric acid solution is set to perform, for example, 50% over-etching of the BOX oxide film 62 which has a film thickness of 145 nm. In such a case, the silicon oxide is etched excessively by about 75 nm. Therefore, the upper faces of the insulating members 33, 34, and 44 are recessed from the upper face of the semiconductor substrate 20 by about 75 nm.

Figure 18:
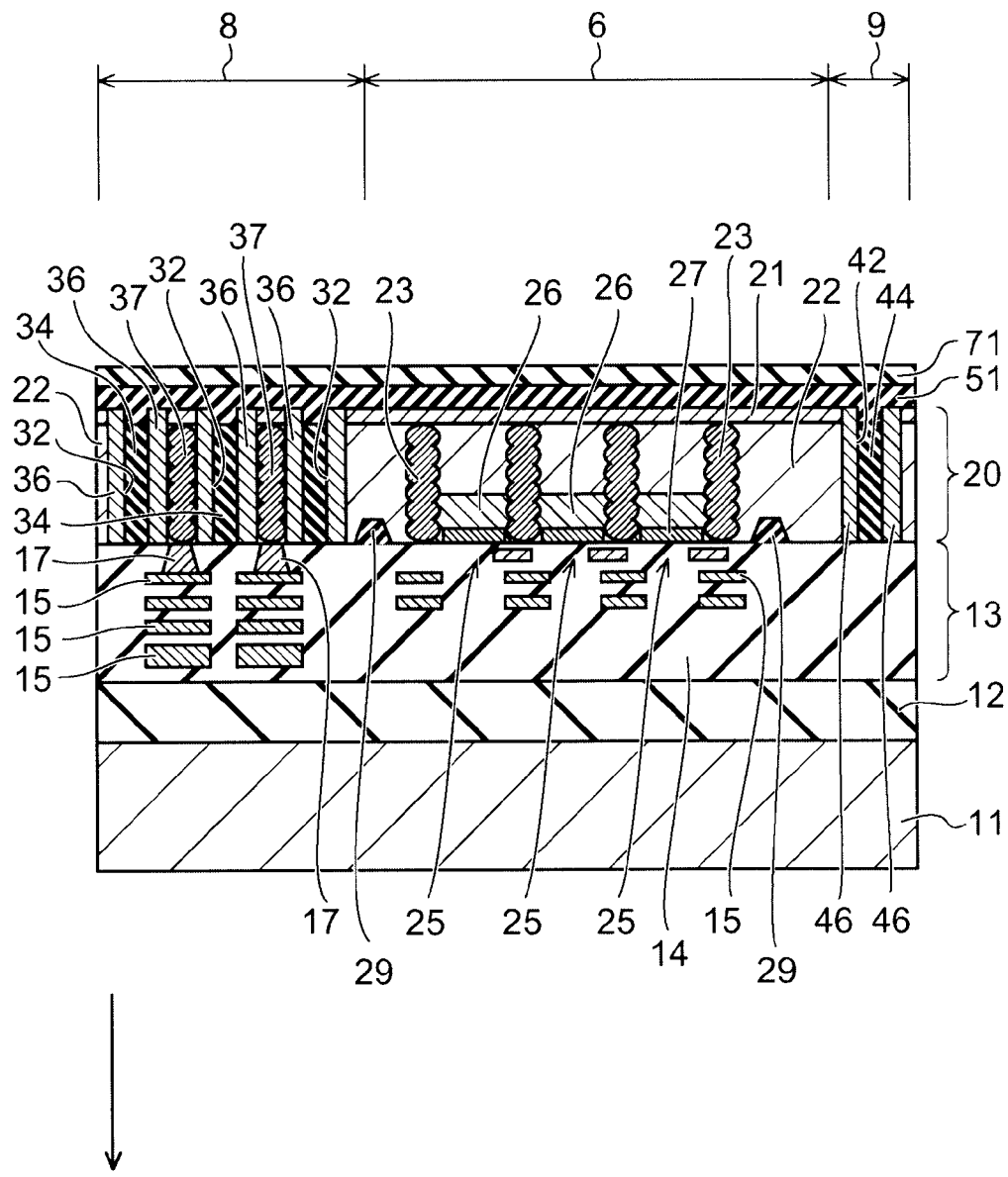

Continuing as illustrated in FIG. 18, the silicon oxide film 51 is formed by plasma CVD. At this time, the film thickness of the silicon oxide film 51 is set to a film thickness to reliably fill the recesses made in the through-trenches 32, etc. (the through-trenches 31, 32, and 42). In the example described above, the film thickness of the silicon oxide film 51 is set to, for example, 150 nm because the depth of the recess made in the through-trench 32 is about 75 nm. Then, a silicon nitride film 71 is formed with a film thickness of, for example, 50 nm by plasma CVD.

Figure 19:
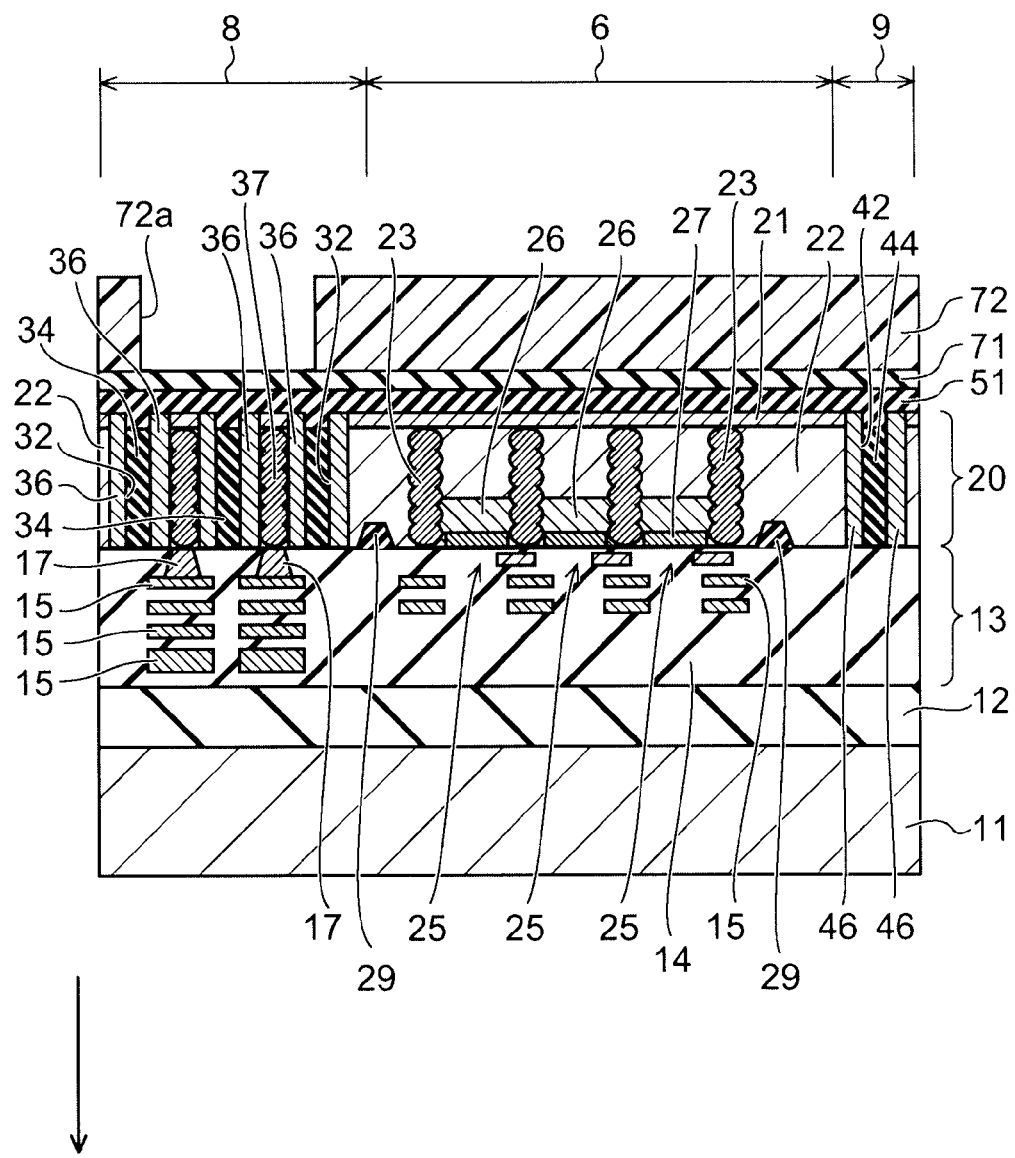

Then, as illustrated in FIG. 19, a photoresist film 72 is formed on the silicon nitride film 71; and exposing and developing are performed to make an opening 72a in the region where the electrode pad 57 (referring to FIG. 2) is to be formed.

Figure 20:
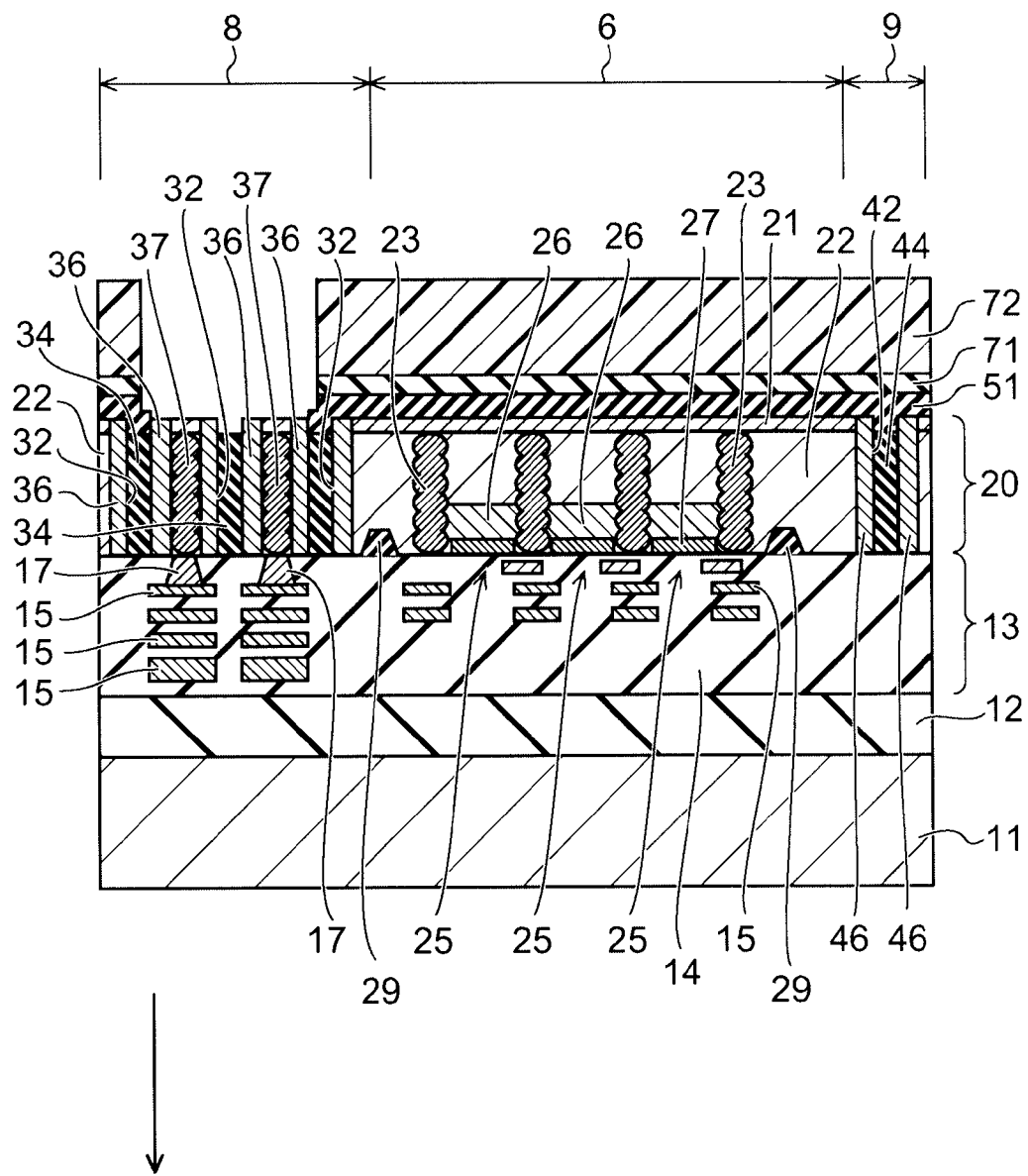

Continuing as illustrated in FIG. 20, dry etching is performed using the photoresist film 72 as a mask to selectively remove the silicon nitride film 71 and the silicon oxide film 51. Thereby, the semiconductor substrate 20 is exposed in the electrode pad region 8. Subsequently, ashing with oxygen plasma is performed to remove the photoresist film 72.

Figure 21:
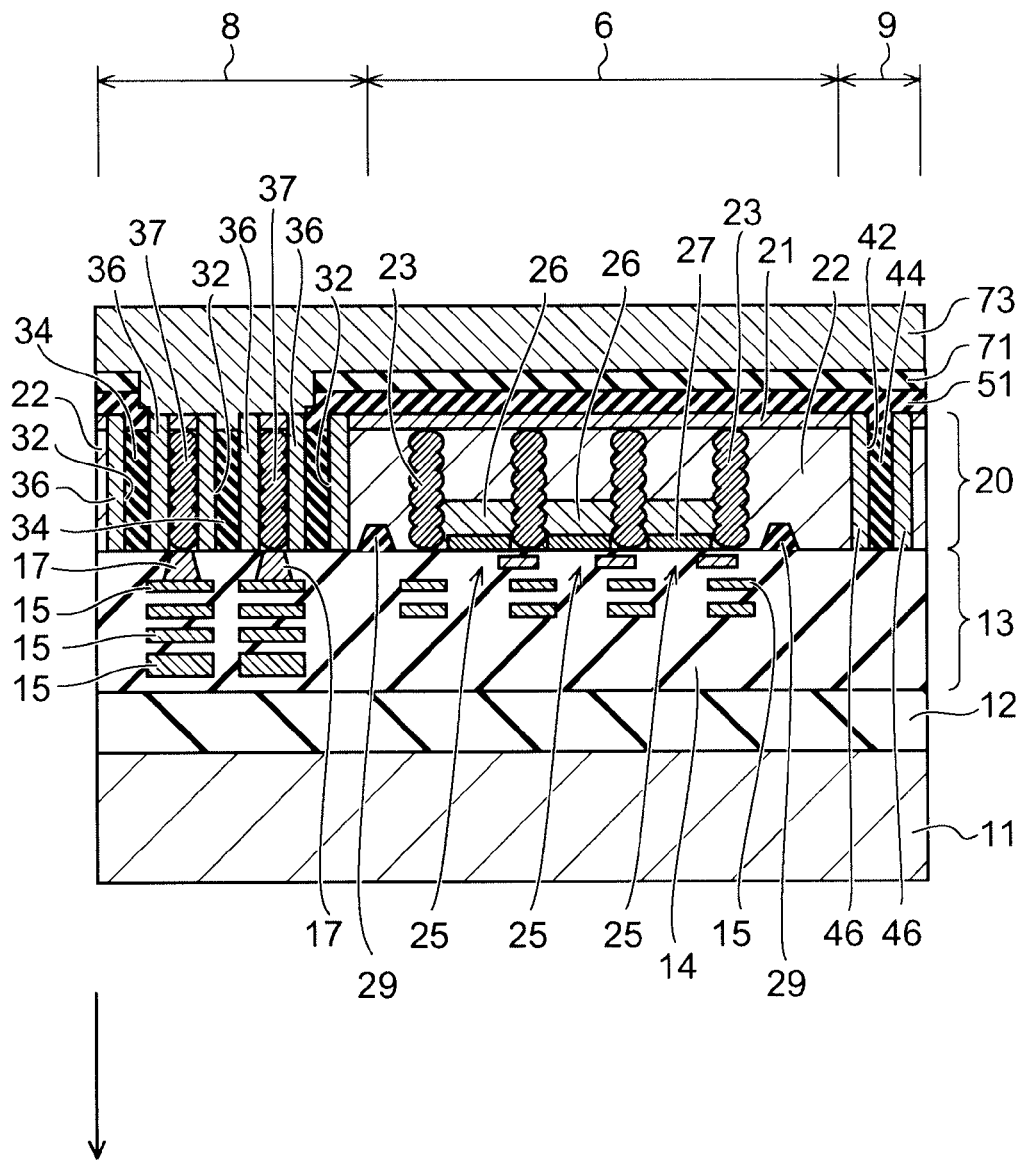

Then, as illustrated in FIG. 21, titanium (Ti), titanium nitride (TiN), and aluminum (Al) are deposited in this order by sputtering to form a conductive film 73 over the entire surface. For example, the thickness of the titanium layer is set to 20 nm; the thickness of the titanium nitride layer is set to 30 nm; and the thickness of the aluminum layer is set to 330 nm. The conductive film 73 contacts the exposed portion of the semiconductor substrate 20 and is connected to the pillar diffusion layer 36 and the p-type conducting region 37 in the electrode pad region 8.

Figure 22:
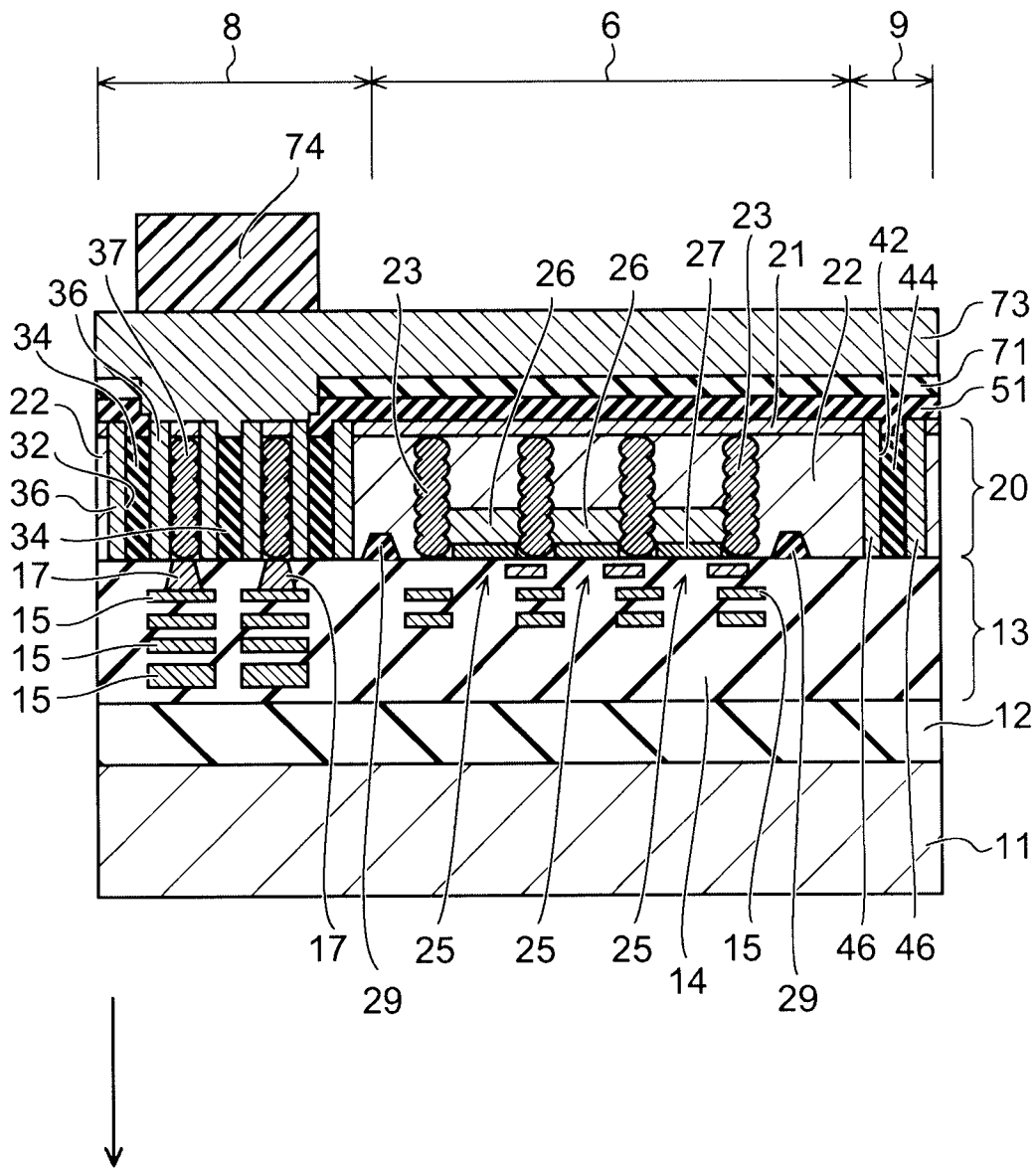

Continuing as illustrated in FIG. 22, a photoresist film 74 is formed on the conductive film 73; and exposing and developing are performed to pattern the photoresist film 74 to cover the region where the electrode pad 57 (referring to FIG. 23) is to be formed.

Figure 23:
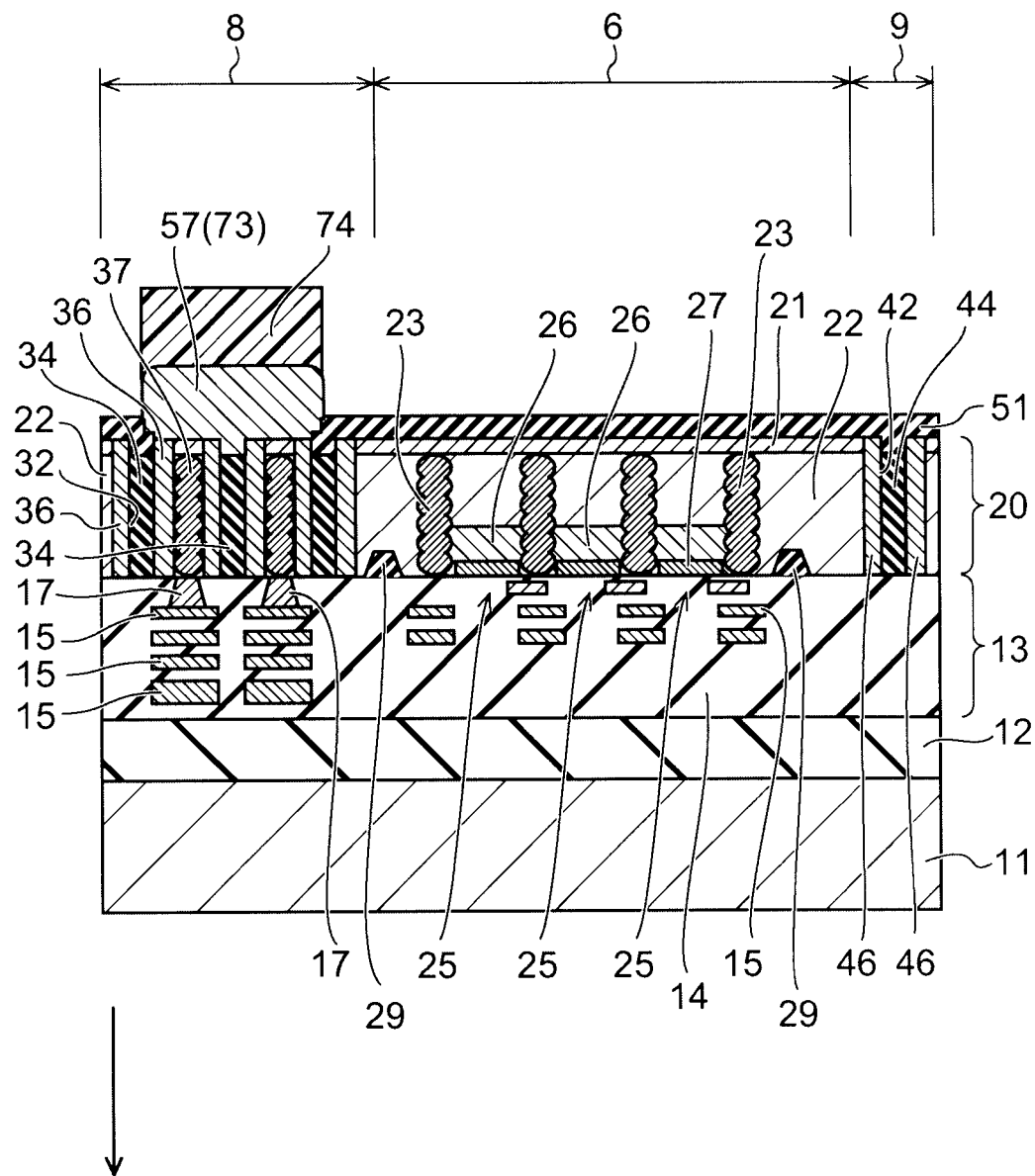

Then, as illustrated in FIG. 23, dry etching is performed using the photoresist film 74 as a mask to selectively remove the conductive film 73. Thereby, the electrode pad 57 is formed of the conductive film 73 remaining in the conducting region 8. At this time, the silicon nitride film 71 (referring to FIG. 22) also is removed by the etching; and the etching stops in the silicon oxide film 51. Subsequently, ashing with oxygen plasma is performed to remove the photoresist film 74.

Figure 24:
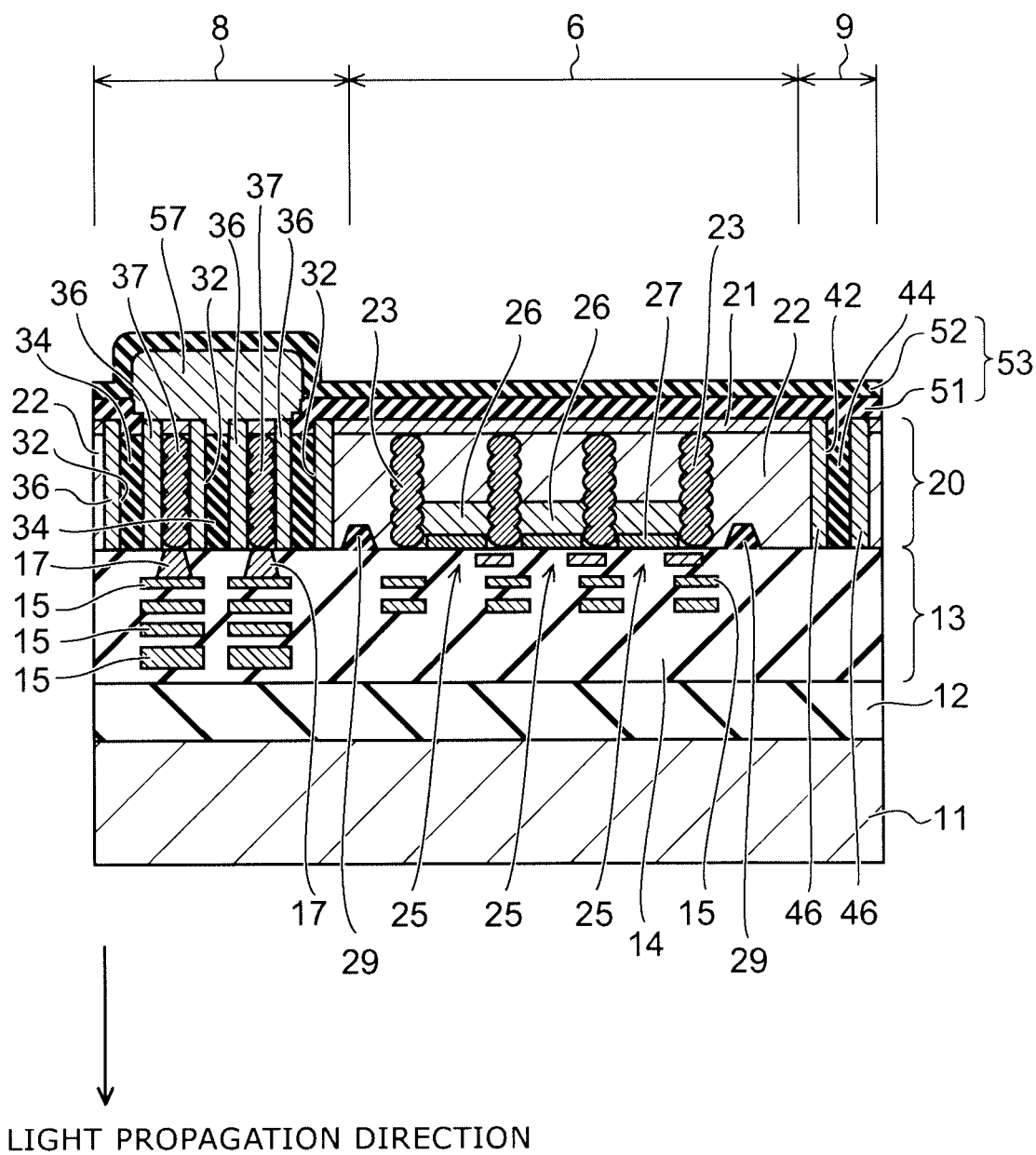

Continuing as illustrated in FIG. 24, the silicon nitride film 52 is formed on the silicon oxide film 51 by plasma CVD to cover the pad electrode 57. The antireflective film 53 is formed of the silicon oxide film 51 and the silicon nitride film 52. At this time, the film thickness of the silicon nitride film 52 is determined considering the optical characteristics such as transmittance and refractive index and is set to, for example, 50 nm.

Figure 25:
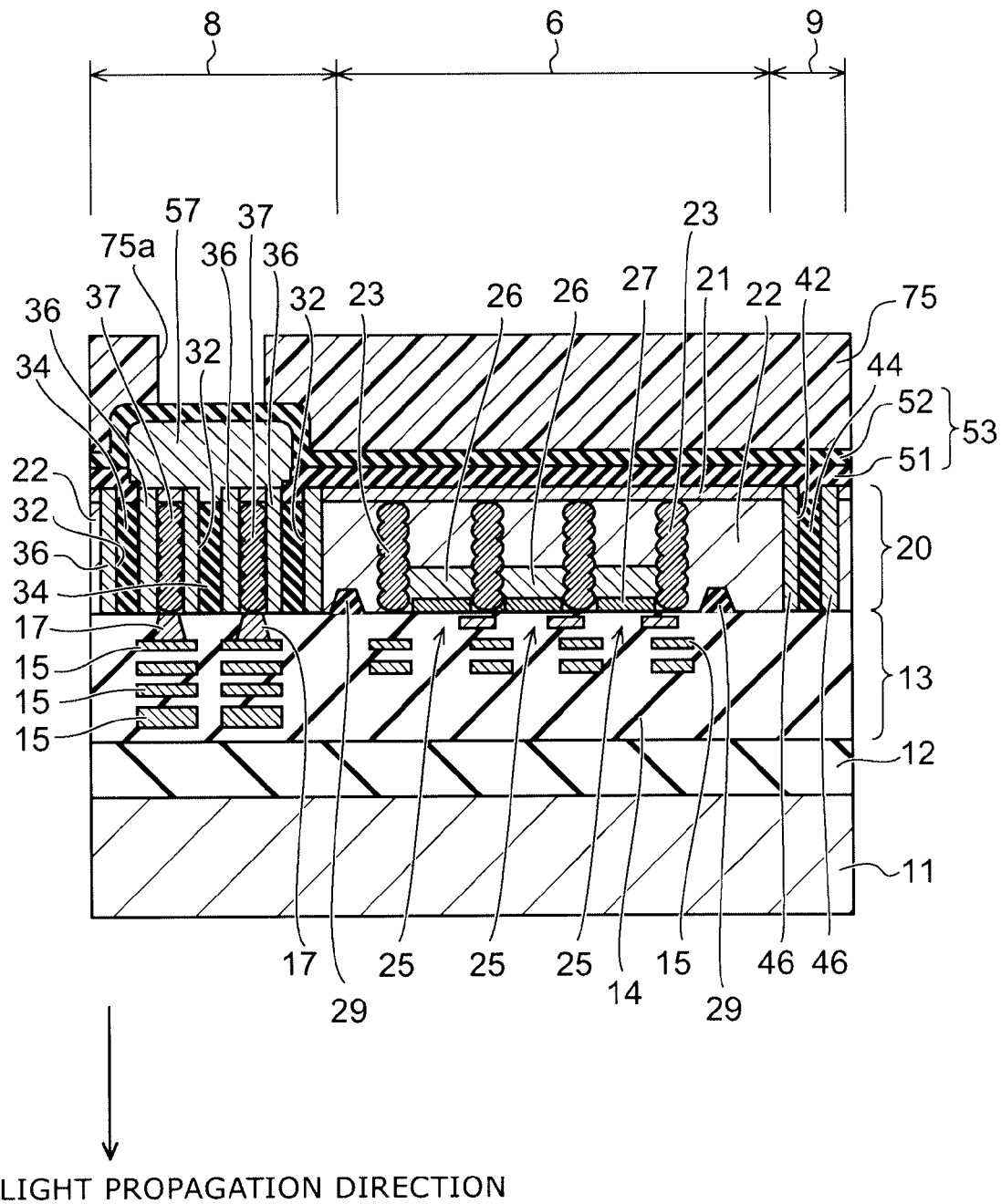

Then, as illustrated in FIG. 25, a photoresist film 75 is formed on the silicon nitride film 52; and exposing and developing are performed to make an opening 75a in a region directly above the central portion of the pad electrode 57.

Figure 26:
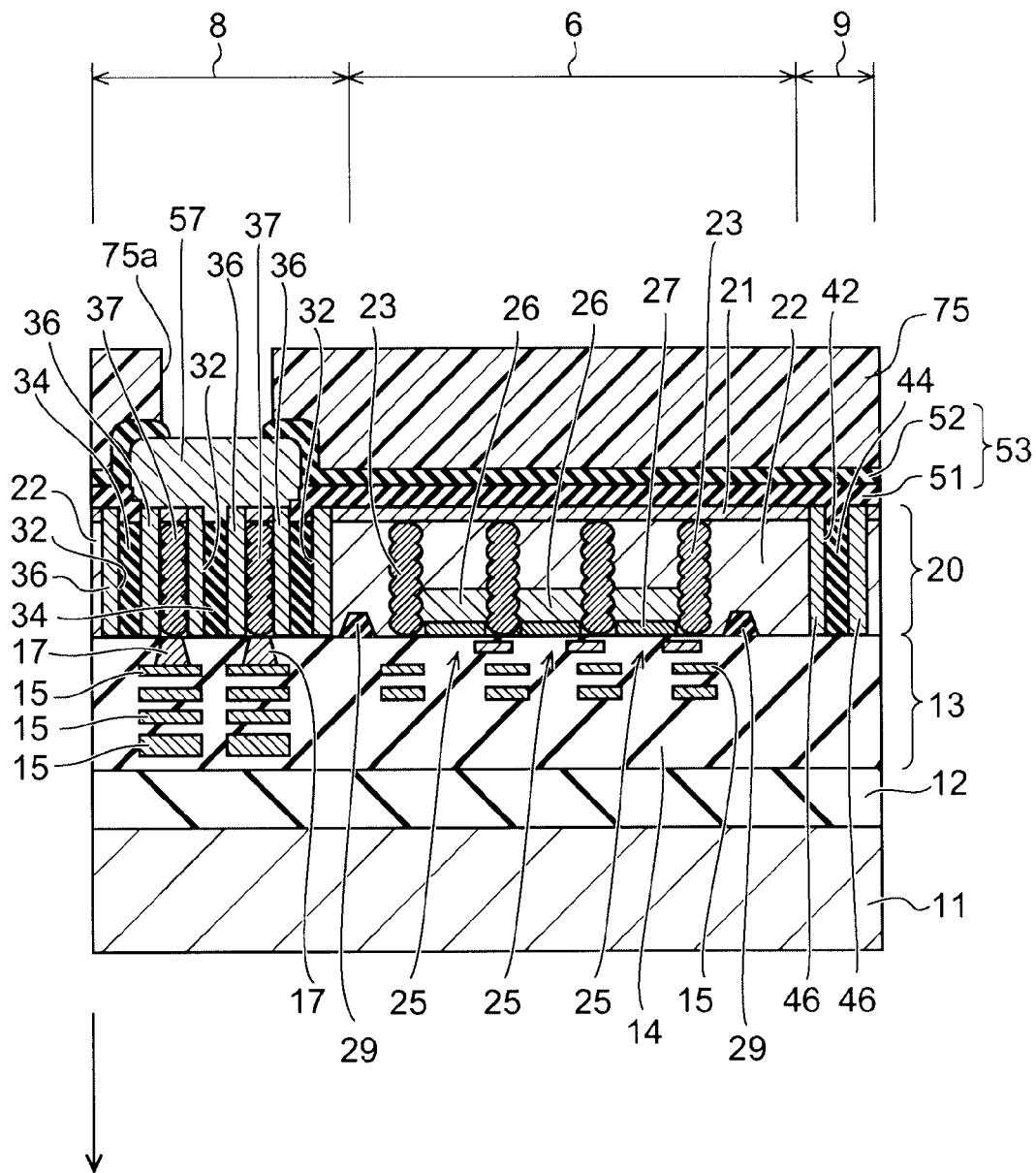

Continuing as illustrated in FIG. 26, dry etching is performed using the photoresist film 75 as a mask to remove the silicon nitride film 52 from the region directly below the opening 75a. Subsequently, ashing with oxygen plasma is performed to remove the photoresist film 75.

Figure 27:
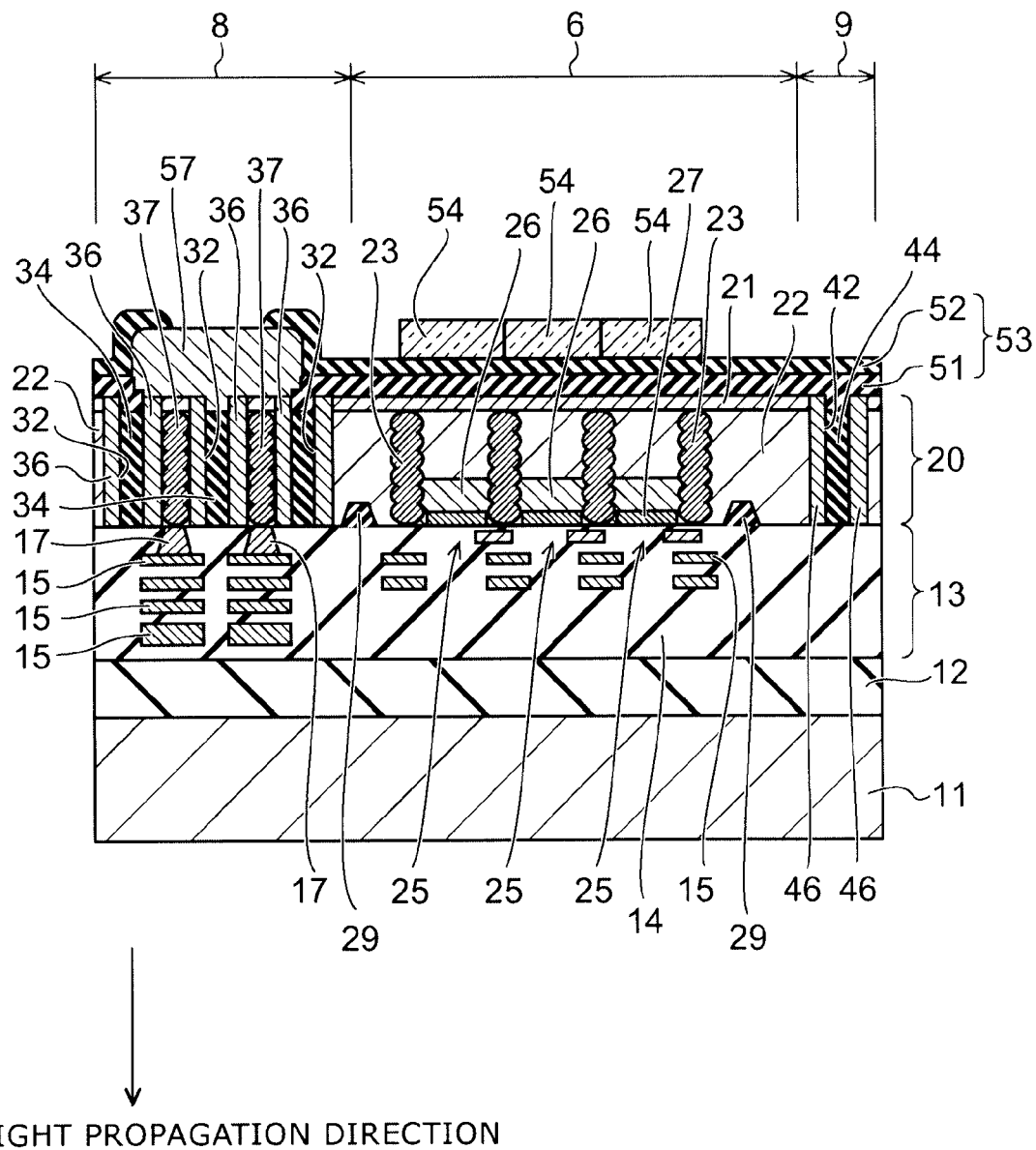

Then, as illustrated in FIG. 27, sintering in a forming gas is performed to alloy the titanium forming the electrode pad 57 with the silicon forming the semiconductor substrate 20 at the contact surface between the electrode pad 57 and the semiconductor substrate 20. Thereby, the contact resistances between the electrode pad 57 and the pillar diffusion layer 36 and between the electrode pad 57 and the p-type conducting region 37 are reduced. Then, red, green, and blue color filters 54 are formed on the silicon nitride film 52 in regions directly above the PD regions 25. At this time, the insulating member 44 is identifiable from the processing surface side because the insulating member 44 is covered only with the thin antireflective film 53. Therefore, the insulating member 44 is used as an alignment mark when forming the color filters 54. The boundary between the color filters 54 is positioned in the region directly above the p-type barrier region 23.

Continuing as illustrated in FIG. 2, the microlens 55 is formed on each of the color filters 54 using the insulating member 44 as an alignment mark. Thereby, the back-side illuminated solid state image capture device 1 is manufactured.

Functional effects of this embodiment will now be described.

First, effects of increasing the positional alignment precision will be described.

In the manufacturing processes of the solid state image capture device 1 of this embodiment, the insulating member 44 filled into the through-trench 42 is used as an alignment mark. Because the insulating member 44 is formed of, for example, silicon oxide, the insulating member 44 has a high contrast with the semiconductor substrate 20 made of silicon and is easily identifiable when observed with, for example, an electron microscope. The insulating member 44 pierces the semiconductor substrate 20 (the silicon layer 63) and is exposed at the upper face and the lower face. Therefore, when forming the p-type barrier layer 23 of the process illustrated in FIG. 13, the insulating member 44 exposed at the upper face (the face opposite to the light incident face) of the silicon layer 63 can be used as an alignment mark; and the positional alignment can be performed directly using the insulating member 44 as the reference. On the other hand, when forming the color filters 54 of the process illustrated in FIG. 27 as well, the insulating member 44 exposed at the upper face (the light incident face) of the semiconductor substrate 20 can be used as an alignment mark; and the positional alignment can be performed directly using the insulating member 44 as the reference.

Thus, the positional alignment of the p-type barrier layer 23 and the color filters 54 can be performed using the same insulating member 44 as the reference. Therefore, little positional shifting occurs between the p-type barrier layer 23 and the color filters 54; and the boundary between the color filters 54 can be disposed reliably in the region directly above the p-type barrier layer 23. In other words, the positional alignment precision between the p-type barrier layer 23 and the color filters 54 is high. As a result, high integration of the pixels is easy.

To describe the effects in greater detail, a first comparative example of this embodiment will now be described.

Figure 28:
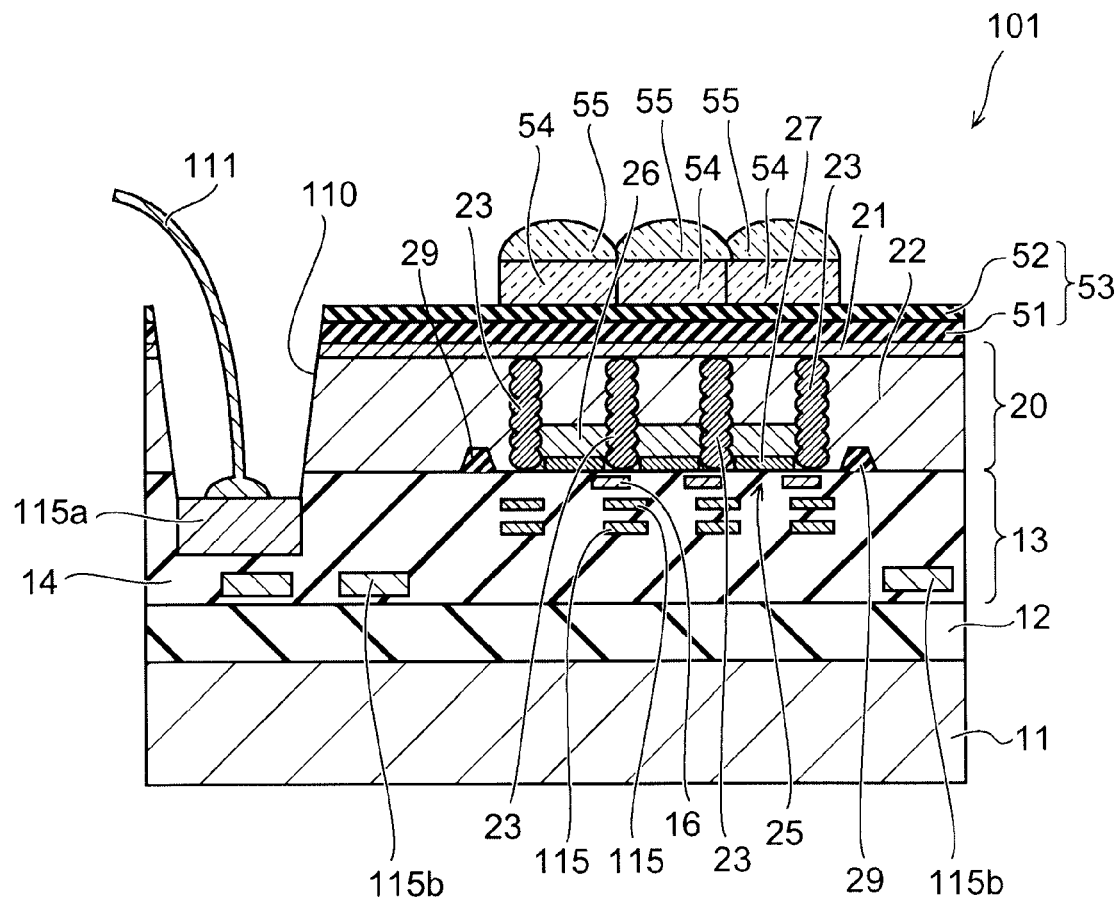
FIG. 28 is a cross-sectional view illustrating a solid state image capture device according to a first comparative example.

FIG. 28 is a cross-sectional view illustrating a solid state image capture device according to this comparative example.

In the solid state image capture device 101 according to this comparative example as illustrated in FIG. 28, the wire bonding method described above in regard to conventional art is applied to the solid state image capture device 1 (referring to FIG. 2) according to this embodiment. In other words, the solid state image capture device 101 differs from the solid state image capture device 1 (referring to FIG. 2) according to this embodiment in that the through-trenches 32, etc. (referring to FIG. 2) are not made in the semiconductor substrate 20; and a large through-contact via 110 is made instead. The through-contact via 110 pierces the semiconductor substrate 20, enters into the multilayered interconnect layer 13, and reaches a metal interconnect 115a provided for the connection. In the solid state image capture device 101, a wire 111 is directly bonded to the metal interconnect 115a provided for bonding via the through-contact via 110.

The insulating member 44 (referring to FIG. 2) is not formed in the solid state image capture device 101. Therefore, as described above in regard to conventional art, the STI 29 is used as the reference of the positional alignment when manufacturing the solid state image capture apparatus 101. Or, a lowermost metal interconnect 115b layer in the multilayered interconnect layer 13 is irradiated from below with an infrared ray and used as an alignment mark when forming the color filters 54. In other words, the positional alignment of the color filter 54 is performed indirectly from the STI 29 via the transfer gate 16, the contact (not illustrated), the uppermost metal interconnect 115 layer, the second metal interconnect 115 layer from the top, the third metal interconnect 115 layer from the top, and the lowermost metal interconnect 115b layer to the color filter 54 in this order. On the other hand, the positional alignment of the p-type barrier region 23 partitioning the pixels also uses the STI 29 as the reference. Thus, the relative positional relationship between the color filter 54 and the p-type barrier region 23 is determined via numerous components therebetween. Therefore, the positional alignment precision is low. As a result, it is difficult to dispose the boundary between the color filters 54 in the region directly above the p-type barrier region 23; and high integration of the pixels is difficult. Although it is conceivable to increase the width of the p-type barrier region 23, the characteristics of the pixels would thereby undesirably decrease, that is, the volume of the PD region 25 would undesirably decrease, the saturation number of electrons would decrease and the sensitivity would decrease, etc.

Effects of increasing the positional alignment precision will now be described using several direct examples. In the following description, it is taken that the pixel pitch (the arrangement period of the PD region 25) is 1.40 µm, of which the width of the p-type barrier region 23 is 0.25 µm and the width of the PD region 25 is 1.15 µm. In such a case, to dispose the boundary between the color filters 54 in the region directly above the p-type barrier region 23, it is necessary for the positional alignment precision of the color filters 54 with respect to the p-type barrier region 23 to be not more than half the width of the p-type barrier region 23 (0.25 µm), i.e., not more than ±0.125 µm. Also, it is taken that four metal interconnect 115 layers are formed in the multilayered interconnect layer 13.

In such a case, in the first comparative example, for an STI-transfer gate alignment precision of 0.025 µm, a transfer gate-contact alignment precision of 0.025 µm, a contact-lowermost metal interconnect layer alignment precision of 0.025 µm, an alignment precision between each of the metal interconnects of the multilayered interconnect layer of 0.050 µm, and a color filter-uppermost metal interconnect layer alignment precision by the transmitted infrared ray of 0.070 µm, the total STI-color filter alignment precision is the sum of squares of the alignment precisions described above, that is, $\pm\sqrt{\{(0.025)^2+(0.025)^2+(0.025)^2+(0.050)^2+(0.050)^2+(0.050)^2+(0.070)^2\}}=\pm0.119$ µm. On the other hand, the STI 29-p-type barrier region 23 alignment precision is 0.070 µm. Therefore, the p-type barrier region 23-color filter 54 alignment precision is the sum of squares thereof, that is, $\pm\sqrt{\{(0.119)^2+(0.070)^2\}}=\pm0.139$ µm which undesirably exceeds the tolerance range described above (not more than ±0.125 µm). Therefore, the boundary between the color filters 54 cannot be disposed reliably in the region directly above the p-type barrier region 23.

Conversely, according to this embodiment, for the same conditions of the first comparative example, the insulating member 44-p-type barrier region 23 alignment precision is 0.070 µm; and the insulating member 44-color filter 54 alignment precision also is 0.070 µm. Therefore, the p-type barrier region 23-color filter 54 alignment precision is the sum of squares thereof, that is, $\pm\sqrt{\{(0.070)^2+(0.070)^2\}}=\pm0.099$ µm. In other words, the precision is within the tolerance range described above (not more than ±0.125 µm). Therefore, the boundary between the color filters 54 can be disposed reliably in the region directly above the p-type barrier region 23.

Effects of reducing the draw out resistance will now be described.

According to this embodiment, the pillar diffusion layer formed around the through-trench 32 is used as a conducting member to draw out the metal interconnect 15 formed in the multilayered interconnect layer 13 to the light incident direction (upward in FIG. 2). In other words, the contact 17 is connected to the electrode pad 57 via the pillar diffusion layer 36. The pillar diffusion layer 36 is formed by implanting an impurity, e.g., boron, into the semiconductor substrate 20 made of monocrystalline silicon. Therefore, the impurity does not precipitate in the crystal grain boundary of the semiconductor substrate 20; and the effective impurity concentration of the pillar diffusion layer 36 can be sufficiently high. Thereby, the resistance of the pillar diffusion layer 36 can be reduced; and the draw out resistance when drawing out the metal interconnect 15 to the outside of the solid state image capture device 1 can be reduced. By forming the p-type conducting region 37 between the pillar diffusion layers 36, the p-type conducting region 37 also contributes to the conduction between the contact 17 and the electrode pad 57. Therefore, the draw out resistance can be reduced even more. As a result, high speed operations of the solid state image capture device 1 can be realized.

To describe the effects in greater detail, a second comparative example of this embodiment will now be described.

Figure 29:
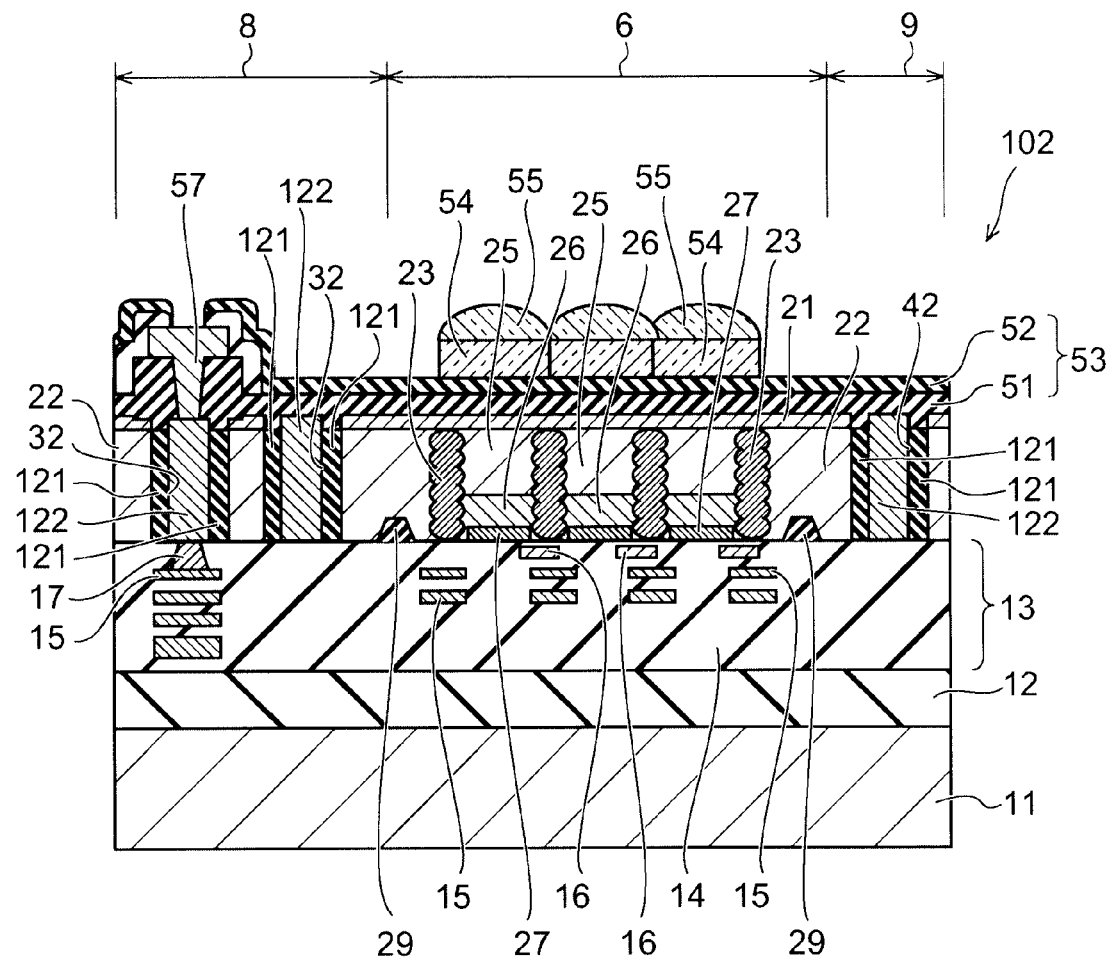
FIG. 29 is a cross-sectional view illustrating a solid state image capture device according to a second comparative example.

FIG. 29 is a cross-sectional view illustrating a solid state image capture device according to this comparative example.

In the solid state image capture device 102 according to this comparative example as illustrated in FIG. 29, an insulating film 121 made of, for example, silicon oxide, is formed on the side faces of the through-holes 31, 32, and 42 (the through-hole 32, etc.). The insulating film 121 is formed on the side faces of the through-holes 32 and 42 in pipe-like configurations along the side faces of the through-holes 32 and 42. A conducting member 122, which is made of polysilicon in which an impurity is implanted, is filled into the interiors of the through-holes 31, 32, and 42. The contact 17 and the electrode pad 57 are connected to the conducting member 122 filled into the through-hole 32.

When manufacturing the solid state image capture device 102 of this comparative example, the insulating film 121 formed on the side face of the through-hole 42 can be utilized as an alignment mark. Therefore, similarly to this embodiment, a high positional alignment precision can be realized. By connecting the contact 17 to the electrode pad 57 via the conducting member 122 filled into the through-hole 32, it is possible to draw out the metal interconnect 15 formed in the multilayered interconnect layer 13 to the light incident side.

However, in the solid state image capture device 102 according to this comparative example, it is necessary to increase the impurity concentration of the conducting member 122 to reduce the draw out resistance. However, in the case where the through-hole 32, etc., are made in the semiconductor substrate 20 and the insulating film 121 is formed on the side faces thereof, and then silicon is re-filled into the interiors of the through-hole 32, etc., the crystalline structure of the re-filled silicon unavoidably and undesirably has a polycrystalline structure. In other words, the conducting member 122 is undesirably formed of polysilicon instead of monocrystalline silicon. Thus, even in the case where a large amount of an impurity is implanted into the conducting member 122, the implanted impurity undesirably precipitates in the crystal grain boundary of the polysilicon; and it is difficult to increase the effective impurity concentration. Therefore, the draw out resistance cannot be reduced sufficiently. As a result, high speed operations in the solid state image capture device 102 are difficult.

It is also conceivable to re-fill metal instead of polysilicon into the interiors of the through-trenches 32, etc. However, the fillability of metal is lower than that of silicon. Therefore, it is necessary to keep the aspect ratio of through-trenches low. Accordingly, it is difficult to downscale the through-trenches. Also, in the case where metal, which has a low heat resistance, is filled, the heat treatment of subsequent processes is constrained. Thereby, for example, the silicide reaction of the interface between the electrode pad 57 and the semiconductor substrate 20 is insufficient; and discrepancies occur such as an increase of the contact resistance.

Conversely, in this embodiment, the pillar diffusion layer 36 and the p-type conducting region 37 are formed in the semiconductor substrate 20 made of monocrystalline silicon. Therefore, the impurity does not precipitate in the crystal grain boundary even when introduced in large amounts. Therefore, the effective impurity concentration of the pillar diffusion layer 36 and the p-type conducting region 37 can be sufficiently high; and the resistance can be reduced. It is favorable to reduce the diameter and the arrangement spacing of the through-trench 32 as much as possible to the extent that the formations of the through-trench 32 and the pillar diffusion layer 36 are not obstructed. Thereby, the arrangement period of the through-trench 32 is reduced; the number of the pillar diffusion layers 36 connected to each of the electrode pads 57 is increased; and the draw out resistance is reduced. As a result, high speed operations of the solid state image capture device 1 are possible.

Effects of reducing process costs will now be described.

In this embodiment as described above, a conducting member piercing the semiconductor substrate 20 is realized by forming the pillar diffusion layer 36 in the electrode pad region 8; and an alignment mark piercing the semiconductor substrate 20 is realized by forming the insulating member 44 in the mark material region 9. In this embodiment, these can be formed by the same series of processes. Therefore, it is unnecessary to provide a dedicated process to form the alignment mark; and process costs can be kept low. In this embodiment, the p-type conducting region 37 and the p-type barrier region 23 are formed simultaneously. This also keeps the process costs low.

In the solid state image capture device 1 according to this embodiment, the through-trench 31 having the frame-like configuration is made in the semiconductor substrate 20 to surround the electrode pad region 8; and the insulating member 33 is filled into the interior thereof. Thereby, the pillar diffusion layer 36 and the p-type conducting region 37 connected between the contact 17 and the electrode pad 57 can be reliably insulated from the other portions of the semiconductor substrate 20. As a result, signals can be prevented from leaking from the current path between the metal interconnect 15 and the electrode pad 57; noise can be prevented from mixing into the current path; and the parasitic resistance of the current path can be reduced. Because the through-trench 31 and the insulating member 33 can be formed simultaneously with the through-trenches 32 and 42 and the insulating members 34 and 44, process costs do not increase.

Hereinabove, the invention is described with reference to exemplary embodiments. However, the invention is not limited to these exemplary embodiments. Additions, deletions, or design modifications of components or additions, omissions, or condition modifications of processes appropriately made by one skilled in the art in regard to the exemplary embodiments described above are included in the scope of the invention to the extent that the purport of the invention is included.

For example, although the example is illustrated in the embodiments described above in which the conductivity type of the pillar diffusion layer 36 is the p-type, the conductivity type of the pillar diffusion layer 36 may be the n-type. In such a case, it is unnecessary to form the p-type conducting region 37 between the pillar diffusion layers 36; and the n-type layer 22 can be utilized as-is. Such a case is favorable because the draw out resistance can be reduced even more by introducing the impurity into the lower portion of the n-type layer 22 of the electrode pad region 8 when introducing the impurity forming the donor during the formation of the peripheral circuit region 7.

Although the example is illustrated in the embodiments described above in which the insulating members 33, 34, and 44 are formed of silicon oxide, the invention is not limited thereto. The insulating members 33, 34, and 44 may be formed of, for example, silicon nitride.

Although the example is illustrated in the embodiments described above in which the through-trenches 32 and 42 have quadrilateral columnar configurations, the invention is not limited thereto. The through-trenches 32 and 42 may have, for example, circular columnar configurations. It is unnecessary for the configuration of the through-trench 32 and the configuration of the through-trench 42 to be the same. The configuration of the through-trench 32 may be set considering the conductivity; and the through-trench 42 may have a configuration favorable as an alignment mark. For example, the through-trench 42 may have a rectangular configuration as viewed from above; and the insulating member 44 may be used to indicate not only position but also direction. Also, although the example is illustrated in the embodiments described above in which the through-trench 31 has a substantially square frame-like configuration, the invention is not limited thereto. For example, the through-trench 31 may have a circular ring configuration.

According to the exemplary embodiments described above, a solid state image capture device having high positional alignment precision of the components and low process costs and a method for manufacturing the same can be realized.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A solid state image capture device, comprising:
   a multilayered interconnect layer including an interconnect;
   a semiconductor substrate on the multilayered interconnect layer, the semiconductor substrate being formed of monocrystalline silicon and having a first conductivity layer, a first through-trench, a second through-trench and a third through-trench adjacent to the first through-trench;
   a first pillar diffusion layer in the semiconductor substrate around the first through-trench, the first pillar diffusion layer being connected to the interconnect;
   a second pillar diffusion layer in the semiconductor substrate around the second through-trench;
   a third pillar diffusion layer in the semiconductor substrate around the third through-trench;
   an insulating member in each of the first and second through-trenches, the insulating member being formed of silicon oxide;
   a first impurity diffusion region of a second conductivity type partitioning the first conductivity layer into a plurality of regions;
   a second impurity diffusion region of the second conductivity type provided between the first and third pillar diffusion layers;
   an electrode pad on the semiconductor substrate and connected to the first pillar diffusion layer, the electrode pad being connected to the interconnect through the third pillar diffusion layer and the second impurity diffusion region; and
   a color filter on the semiconductor substrate for each of the partitioned regions,
   the electrode pad and the color filter being provided on a side on which light is incident, and
   the multilayered interconnect layer being provided on a side opposite to the side on which light is incident.

2. The device according to claim 1, wherein the first to third through-trenches have a quadrilateral columnar configuration.

3. The device according to claim 1, wherein the first to third through-trenches have a circular columnar configuration.

4. The device according to claim 1, wherein the first to third pillar diffusion layers are of the first conductivity type.

5. The device according to claim 1, further comprising a support substrate over a lower face of the multilayered interconnect layer.

6. The device according to claim 1, wherein the first, second and third pillar diffusion layers have the same conductivity type.

7. The device according to claim 1, wherein the first, second and third pillar diffusion layers have the same impurity concentration.

* * * * *